(12) United States Patent
Konstantatos et al.

(10) Patent No.: US 10,070,083 B2
(45) Date of Patent: Sep. 4, 2018

(54) IMAGE SENSOR, OPTOELECTRONIC SYSTEM COMPRISING SAID IMAGE SENSOR, AND METHOD FOR MANUFACTURING SAID IMAGE SENSOR

(71) Applicant: FUNDACIÓ INSTITUT DE CIÈNCIES FOTÒNIQUES, Castelldefels (ES)

(72) Inventors: Gerasimos Konstantatos, Castelldefels (ES); Frank Koppens, Castelldefels (ES); Stijn Goossens, Castelldefels (ES); Juan José Piqueras, Castelldefels (ES); Raúl Pérez, Castelldefels (ES)

(73) Assignee: Fundació Institut de Ciències Fotòniques, Castelldefels (ES)

( * ) Notice: Subject to any disclaimer, the term of this patent is extended or adjusted under 35 U.S.C. 154(b) by 81 days.

(21) Appl. No.: 15/178,857

(22) Filed: Jun. 10, 2016

(65) Prior Publication Data

US 2016/0366354 A1 Dec. 15, 2016

(30) Foreign Application Priority Data

Jun. 10, 2015 (EP) .................................... 15171314

(51) Int. Cl.
*H04N 5/361* (2011.01)
*H01L 27/146* (2006.01)
(Continued)

(52) U.S. Cl.
CPC ....... *H04N 5/361* (2013.01); *H01L 27/14612* (2013.01); *H01L 27/14623* (2013.01);
(Continued)

(58) Field of Classification Search
CPC ........ H04N 5/361; H04N 5/374; H04N 5/378; H01L 27/14643; H01L 27/14689;
(Continued)

(56) References Cited

U.S. PATENT DOCUMENTS

| 6,107,618 A | 8/2000 | Fossun et al. |
| 8,053,782 B2 | 11/2011 | Avouris et al. |

(Continued)

FOREIGN PATENT DOCUMENTS

| EP | 1628348 A1 | 2/2006 |
| GB | 2514576 A | 12/2014 |
| WO | WO 2013/017605 | 2/2013 |

OTHER PUBLICATIONS

Ohta, "Smart CMOS Image Sensors and Applications," CRC Press (Sep. 19, 2007).

(Continued)

*Primary Examiner* — Twyler Haskins
*Assistant Examiner* — Angel L Garces-Rivera
(74) *Attorney, Agent, or Firm* — Jenkins, Wilson, Taylor & Hunt, P.A.

(57) ABSTRACT

The invention relates to an image sensor comprising a plurality of pixels operatively connected to a control unit that includes a readout circuit, characterized in that it comprises a monolithic three-dimensional integrated circuit comprising an upper level and a lower level; wherein each pixel comprises: a photosensitive element arranged in said upper level and comprising a photosensitizing layer associated to a transport layer; an active device arranged in said lower level and operatively coupled to the photosensitive element; and a first intermediate terminal and an output terminal circuitally connected, respectively, to the photosensitive element and to the readout circuit; wherein the image sensor further comprises a dark current suppressing circuit; and wherein the control unit is configured to, upon readout of a pixel, circuitally connect the first intermediate terminal of said pixel with its output terminal through the dark current suppressing circuit. The invention also relates to an opto- (Continued)

electronic system comprising said image sensor and to a method of manufacturing said image sensor.

19 Claims, 19 Drawing Sheets

(51) Int. Cl.
    *H04N 5/374*     (2011.01)
    *H04N 5/378*     (2011.01)
(52) U.S. Cl.
    CPC .. *H01L 27/14632* (2013.01); *H01L 27/14634* (2013.01); *H01L 27/14636* (2013.01); *H01L 27/14643* (2013.01); *H01L 27/14645* (2013.01); *H01L 27/14689* (2013.01); *H04N 5/374* (2013.01); *H04N 5/378* (2013.01)
(58) Field of Classification Search
    CPC ......... H01L 27/14636; H01L 27/14612; H01L 27/14632; H01L 27/14623; H01L 27/14645; H01L 27/14634
    See application file for complete search history.

(56) References Cited

U.S. PATENT DOCUMENTS

| | | |
|---|---|---|
| 8,796,741 B2 | 8/2014 | Gu et al. |
| 8,803,128 B2 | 8/2014 | Sargent et al. |
| 2008/0093554 A1 | 4/2008 | Hoffman et al. |
| 2011/0315949 A1 | 12/2011 | Voutilainen et al. |

OTHER PUBLICATIONS

Konstantatos et al., "Solution-Processed Quantum Dot Photodetectors," Proceedings of the IEEE, IEEE, New York, US, vol. 97 No. 10., ISSN: 0018-9219, pp. 1666-1683 (Oct. 1, 2009).

Ryzhii et al., "Terahertz and infrared photodetection using p-i-n multiple-graphene-layer structures," Journal of Applied Physics, American Institute of Physics, US, vol. 107 No. 5., ISSN: 0021-8979, pp. 54512-54512 (Mar. 9, 2010).

IMAGE SENSOR, OPTOELECTRONIC SYSTEM COMPRISING SAID IMAGE SENSOR, AND METHOD FOR MANUFACTURING SAID IMAGE SENSOR

CROSS REFERENCE TO RELATED APPLICATION

This application is based on and claims priority to European Patent Application Serial No. 15171314.6, filed Jun. 10, 2015, the disclosure of which is incorporated by reference herein in its entirety.

FIELD OF THE INVENTION

The present invention relates to the field of image sensors, in particular image sensors comprising a plurality of pixels operatively connected to a control unit that includes a readout circuit for selectively reading out the plurality of pixels. An image sensor according to the present invention achieves a simple and efficient integration of the plurality of pixels with the control unit in a small footprint, leading to a compact integrated circuit architecture, and attains an improved pixel sensitivity. Moreover, the particular pixel design of the image sensor of the invention makes it possible to obtain pixels with high photoconductive gain, enhanced responsivity, and/or short response time. The present invention also relates to an optoelectronic system comprising said image sensor, and to a method for manufacturing said image sensor.

BACKGROUND OF THE INVENTION

The use of image sensors is known in numerous applications ranging from the general-consumer gadgets sector, to the professional photography, and to industrial, medical and/or scientific uses, just to cite a few.

A typical image sensor comprises a plurality of pixels, each comprising a photosensitive element or photodetector, that are operatively connected to a control unit that includes a readout circuit for selectively reading out the photo-signal generated by the light impinging on the photosensitive element of each pixel of the plurality of pixels.

Most image sensors use a photodiode as the photosensitive element in their pixels. Given that the quantum efficiency of typical photodiodes cannot exceed one for the visible and infrared ranges, such image sensors critically rely on reaching very low noise levels and/or on using long exposure times, to achieve high signal-to-noise ratios.

However, both of these techniques have important shortcomings. For example, designing the image sensor circuitry to achieve low noise requires placing a pre-amplification stage as close to the charge-generating element (i.e., the photodiode) as possible, as it is done for instance in an active pixel sensors in which the an amplifier is integrated inside the pixel. Moreover, the design of the overall readout circuit becomes more sophisticated. On the other hand, increasing the exposure time reduces the effective frame rate of the image sensor and may lead to blurring effects. Moreover, a longer exposure time enhances the adverse effect of thermal noise, which in turn makes the design requirements for the readout circuit even more demanding.

Other known technologies, such as for instance avalanche photodiodes or image intensifiers, despite being able to provide photodetectors with some photoconductive gain via carrier multiplication effects, have proven to be difficult to integrate into high-resolution image sensors. Moreover, these technologies require operation conditions that are unsuitable for practical image sensors (e.g. avalanche photodiodes typically require very high reverse bias voltages for proper operation), as described for example in chapter 2 of "Smart CMOS Image Sensors and Applications", Jun Ohta, CRC Press, Sep. 19 2007.

The use of active devices based on two-dimensional (2D) materials, such as for instance graphene, for different applications is the object of on-going research. For example, single-pixel photodetectors having a photosensitive element made of graphene have been demonstrated as proof of concept. The use of photodetectors based on 2D materials (e.g., graphene, as disclosed in for instance U.S. Pat. No. 8,053,782 B2) or on semiconductor nanocrystals (e.g. quantum dots, see for example patent U.S. Pat. No. 8,803,128 B2) in the pixels of full-size image sensors has also been proposed. However, such image sensors typically exhibit limited photoconductive gain.

Document WO 2013/017605 A1 discloses a phototransistor comprising a transport layer made of graphene, and a sensitizing layer disposed above the transport layer and that is made of colloidal quantum dots. The sensitizing layer absorbs incident light and induces changes in the conductivity of the transport layer to which it is associated. The high carrier mobility of graphene and the long carrier lifetime in the quantum dots make it possible for the phototransistor disclosed therein to obtain a large photoconductive gain. However, the device can only achieve desired responsivity levels at the expense of increased dark current levels, which in turn degrade the sensitivity and the shot-noise limit of the device.

Therefore, it would be highly desirable to have image sensors in which the photosensitive element of their pixels was capable of providing a high photoconductive gain, but without compromising the pixel sensitivity due to, for example, high dark current levels.

Another important aspect to take into account is the spectral range in which an image sensor is to operate as it will greatly determine the choice of the available light-absorbing materials for the fabrication of the photosensitive element of the pixels.

In that sense, silicon is widely used in image sensors operating in the visible and near infrared ranges. In contrast, compounds such as InGaAs or HgCdTe, among others, are often employed for the infrared range (including short-wave infrared and/or long-wave infrared subranges). Finally, for image sensors operating in the ultraviolet region, and shorter-wave ranges, some known suitable materials include wide-gap semiconductors, such as for instance AlGaN. Alternatively, technologies based on back-thinning of silicon or on intensified imagers, such as for example microchannel plate (MCP) photodetectors, can also be used for shorter-wave ranges.

On the other hand, in most image sensors the readout circuit (usually also referred to as readout integrated circuit, or ROIC) is implemented in silicon, for example using CMOS technology.

This means that a monolithic integration of the plurality of pixels of an image sensor with the readout circuit of said pixels can only be achieved for those image sensors designed to operate in the visible and/or near infrared ranges. However, image sensors operating in other spectral ranges will require hybrid integration of silicon (e.g., CMOS technology) with other materials used for the photodetectors of the pixels, such as InGaAs. Such hybrid integration involves difficult and costly bonding processes, as described for example in US 2008/093554 A1 and in U.S. Pat. No. 6,107,618 A, which in turn impose a lower limit on the pixel size.

Developed in the last years, three dimensional (3D) integrated circuit technology allows the fabrication of integrated circuits by arranging active devices (e.g. transistors) in several levels at different heights, hence advantageously exploiting the third dimension of the structure.

In addition to obtaining very compact structures with reduced footprint, 3D integrated circuits offer an improved electrical performance compared to conventional integrated circuits. For example, as electrical interconnects can be distributed over an entire surface between levels of active devices, a higher density of shorter interconnects is possible, which results in faster circuits featuring more bandwidth. In addition, heterogeneous integration of circuits of different manufacturing technologies and/or materials becomes possible, by using for example wafer bumping processes to form interconnects.

A first type of 3D fabrication technology, known as 3D packaging, consists of stacking several semiconductor wafers and/or dies and interconnecting them vertically using through-substrate vias (TSVs) and traditional interconnect technology such as wire and/or flip-chip bonding to achieve a fully-operative vertical stack. Alternatively, monolithic 3D integration is another type of 3D fabrication technology in which layers of active devices are grown or deposited sequentially on a same substrate.

Document U.S. Pat. No. 8,796,741 B2 discloses a monolithic 3D integrated circuit device that includes a first level comprising a first plurality of active devices, and a second level comprising a second plurality of active devices that comprise a layer of graphene.

It is therefore an object of the present invention to provide an enhanced image sensor in which the integration of its pixels with the control unit can be done in a simple and efficient manner while leading to a highly compact integrated circuit architecture.

It is also an object of the present invention to provide an image sensor in which its pixels comprise an improved photosensitive element capable of high photoconductive gain, enhanced responsivity, and/or short response time.

It is yet another object of the present invention to provide an image sensor with an improved sensitivity of its pixels, and that does not require deep cooling of the device to achieve high signal-to-noise ratios.

US 2011/315949 A1 discloses an apparatus and method for sensing photons, where the apparatus includes a plurality of photon sensing layers arranged on top of each other, and an intermediate color filtering layer between each two adjacent photon sensing layers to prevent a respective color component of light from proceeding into the photon sensing layer next to it. Regarding the color filtering layers, for some embodiments, they include reflective coatings made of, for example, a ZnO layer. No other function for such a ZnO layer is disclosed in US 2011/315949.

To fully understand the differences between the apparatus of US 2011/315949 A1 and the present invention, it must be pointed out that a photo sensitizing layer (as defined in the present document) absorbs incident light and induces changes in the conductivity of the transport layer to which it is associated. The apparatus of US 2011/315949 A1 does not include such an arrangement of a photo sensitizing layer (i.e. an absorbing layer) and a transport layer, but, in contrast, the absorbing layer is the same as the transport layer, specifically the layer called photon sensing layer, and hence no photo sensitizing layer is disclosed at all in US 2011/315949 A1.

In the apparatus disclosed in US 2011/315949 A1, the photo sensing layer, which is made of graphene, absorbs only about 2.3% of the light and hence many layers of graphene are needed to achieve a high external quantum efficiency.

No dark current suppressing circuit is either disclosed in US 2011/315949 A1. Indeed, neither the electrodes nor any other element of the apparatus of US 2011/315949 A1 implements a dark current suppressing circuit.

SUMMARY OF THE INVENTION

The objects of the present invention are solved with the image sensor of claim 1, the optoelectronic system of claim 15 and the method for manufacturing an image sensor of claim 16. Other favorable embodiments of the invention are defined in the dependent claims.

An aspect of the present invention relates to an image sensor comprising a plurality of pixels operatively connected to a control unit that includes a readout circuit for selectively reading out the photo-signals generated by the light impinging on the plurality of pixels. The image sensor is characterized in that it comprises a monolithic three-dimensional integrated circuit comprising an upper level having a first plurality of stacked layers and a lower level having a second plurality of stacked layers, the lower level being disposed underneath the upper level. Each pixel of the plurality of pixels comprises:
  a photosensitive element arranged at a selected location of said upper level, the photosensitive element comprising a photosensitizing layer associated to a transport layer, the transport layer including at least one layer of a two-dimensional material;
  an active device arranged at a selected location of said lower level, the active device comprising at least one layer of a semiconductor material and being operatively coupled to the photosensitive element;
  a first intermediate terminal circuitally connected to the photosensitive element; and
  an output terminal circuitally connected to the readout circuit.

In accordance with the present invention, a photosensitizing layer associated to a transport layer preferably refers to the fact that the photosensitizing layer is arranged/disposed above (such as for instance directly above) or alternatively below (such as for instance directly below) the transport layer of said photosensitive element.

The adjective "intermediate" has been used to identify the above mentioned first intermediate terminal because that terminal is a circuital element situated in an intermediate position of the pixel, before the output terminal, and serves the purpose of connecting the photosensitive element with the output terminal and thus with other components of the electrical circuit connected to said output terminal.

The image sensor of the present invention further comprises a dark current suppressing circuit configured to substantially suppress the dark current generated by the photosensitive element of the pixels during an exposure cycle. Moreover, the control unit of the image sensor of the present invention is arranged, at least partially, in said lower level and configured to, when a given pixel is to be read out, circuitally connect the first intermediate terminal of said pixel:

with the output terminal of said pixel through the dark current suppressing circuit; or with the output terminal of said pixel and with the dark current suppressing circuit.

As stated above, regarding US 2011/315949 A1, the graphene photo sensing layer of the apparatus disclosed therein absorbs only 2.3% of the light. In contrast, the photo sensitive element of the image sensor of the present invention absorbs almost 100% of the light, thus achieving a high external quantum efficiency.

Because of the use of a monolithic three-dimensional integrated circuit, it is possible to obtain an image sensor having a very compact architecture. In particular, by arranging the photosensitive element of the pixels in the upper level and the active device of the pixels in the lower level, the footprint of the pixels can be made very small without compromising the pixel fill factor, which can still be very high or even close to 100%. Moreover, efficient use of the height of the structure is obtained by providing the control unit partially, or even entirely, in the lower level.

In the context of the present invention a monolithic three-dimensional integrated circuit preferably refers to a stacked arrangement of layers grown or deposited sequentially on a same substrate.

The control unit may be arranged in one or more layers of the lower level of the monolithic three-dimensional integrated circuit, wherein one of said one or more layers is a layer of a semiconductor material. In some embodiments the layer of a semiconductor material of the control unit is disposed above or below the layer of a semiconductor material of the active element of the pixels. However, in other embodiments they are a same layer.

In the context of the present invention the term two-dimensional material preferably refers to a material that comprises a plurality of atoms or molecules arranged as a two-dimensional sheet with a thickness substantially equal to the thickness of the atoms or molecules that constitute it.

In some embodiments, the transport layer of the photosensitive element of one or more pixels includes at least five, ten, twenty, forty or even fifty layers of a two-dimensional material.

Also in the context of the present invention a photosensitizing layer being associated to a transport layer preferably refers to the fact that light absorption in the photosensitizing layer results in a change in charge carrier density inside the transport layer, which, for an embodiment, comprises graphene.

This can for example be due to the following processes:

An electron (or a hole) from an electron-hole pair generated in the photosensitizing layer by the absorption of a photon can be transferred to the transport layer while the hole (or the electron) of said electron-hole pair remains trapped in the photosensitizing layer, or an interface between the photosensitizing layer and the transport layer, such as for instance in a dielectric layer disposed there between. In some embodiments, the photosensitizing layer is disposed above, such as for example directly above, the transport layer. Alternatively, in some other embodiments the photosensitizing layer is disposed below, such as for example directly below, the transport layer, so that a photon must cross the transport layer before reaching the photosensitizing layer where it will be absorbed.

Alternatively, light absorption in the photosensitive layer leads to bound charges in the proximity of the surface of the photosensitive layer. This draws charges into the graphene and/or into any other material forming the transport layer, which changes its electrical conductivity.

In this sense, the heterojunction formed by the photosensitizing layer and the transport layer slows down recombination and makes it possible to collect several electric carriers for a single absorbed photon, which compounded with the high carrier mobility of the two-dimensional material comprised in the transport layer, results in the photosensitive element of the pixels featuring very high photoconductive gain and responsivity.

In addition, the spectral sensitivity of the photosensitive element of the pixels can be advantageously tailored by appropriately selecting the material of the photosensitizing layer. In this manner, the spectral range for photodetection of the photosensitive element can be extended over a large bandwidth.

Finally, the dark current suppressing circuit makes it possible to substantially suppress the dark current generated in the photosensitive elements as a result of the biasing voltage. In this way it is no longer needed to give up in terms of electrical performance of the photosensitive elements (e.g. in terms of responsivity) in order to keep the dark current levels low. In consequence, regardless the biasing voltage applied, the image sensor of the present invention makes it possible to obtain enhanced pixel sensitivity and high signal-to-noise ratios, even without cooling the device.

In the context of the present invention, the dark current generated by the photosensitive element of a pixel during an exposure cycle is considered to have been substantially suppressed if the residual dark current at an output node of the dark current suppressing circuit is smaller than a 25%, 20%, 15%, 10%, 8%, 5%, 3% or even 1% of the original dark current at an input node of the dark current suppressing circuit.

Alternatively, in some embodiments of the present invention, the control unit of the image sensor is configured to, when a given pixel is to be read out, circuitally connect the first intermediate terminal of said pixel with the output terminal of said pixel, said output terminal being circuitally connected to the readout circuit through the dark current suppressing circuit.

In some embodiments, the photosensitizing layer of the photosensitive element of one or more pixels comprises a photo-absorbing semiconductor, a 2D material, a polymer, a dye, quantum dots (such as for instance colloidal quantum dots), ferroelectrics, Perovskite and/or a combination thereof.

The photosensitizing layer may for example comprise nanocomposite films containing blends of the aforementioned materials. It may also be a single-layered structure or, alternatively, a multi-layered structure, in which one or more of the aforementioned materials constitute different layers stacked on each other, each having thicknesses preferably between approximately 5 nm and approximately 400 nm.

In those embodiments in which the photosensitizing layer comprises quantum dots, these are preferably of one or more of the following types: $Ag_2S$, $Bi_2S_3$, CdS, CdSe, CdHgTe, $Cu_2S$, CIS (copper indium disulfide), CIGS (copper indium gallium selenide), CZTS (copper zinc tin sulfide), Ge, HgTe, InAs, InSb, ITO (indium tin oxide), PbS, PbSe, Si, $SnO_2$, ZnO, and ZnS.

Similarly, in some embodiments the at least one layer of a two-dimensional material comprised in the transport layer of the photosensitive element of one or more pixels comprises one or more of the following materials: graphene, $MoS_2$, $MoSe_2$, $WS_2$, $WSe_2$, black phosphorus, $SnS_2$, and h-BN (hexagonal boron nitride).

In some embodiments of the present invention, the dark current suppressing circuit comprises at least one level shifter adapted to subtract a voltage level that is substantially equal to the voltage level generated by the dark current of the photosensitive element of the pixels during an exposure cycle. Moreover, in these embodiments, the control unit is configured to, when a given pixel is to be read out, circuitally connect the first intermediate terminal with an input node of a given level shifter of said at least one level shifter and the output terminal of said pixel with an output node of said given level shifter.

The level shifter performs dark frame subtraction by advantageously removing an estimate of the mean fixed-pattern noise due to the dark current integration during the exposure cycle.

In the context of the present invention, two voltage levels are considered to be substantially equal if one differs from the other in less than a 25%, 20%, 15%, 10%, 8%, 5%, 3% or even 1%.

In the context of the present invention, a layer (or an element or a device) of the monolithic three-dimensional integrated circuit is considered to be above another, if the former is farther from the at least one layer of a semiconductor material of the lower level of the monolithic three-dimensional integrated circuit than the latter, along a direction perpendicular to said at least one layer of a semiconductor material.

Similarly, a layer (or an element or a device) of the monolithic three-dimensional integrated circuit is considered to be below another, if the former is closer to the at least one layer of a semiconductor material of the lower level of said monolithic three-dimensional integrated circuit than the latter, along said perpendicular direction.

Also in accordance with the present invention, the term above (or below) is not to be construed as implying than one layer (or element or device) is immediately or directly above (or below) another unless explicitly stated otherwise. In that sense, a layer being disposed above (or below) another does not preclude the possibility of additional layers being arranged in between those two.

In the same manner, in the context of the present invention the term circuitally connected preferably refers to the fact that a first entity (e.g., a terminal, an element or a circuit) may be connected to a second entity by means of a circuit, which may comprise one or more conductive traces and/or one or more circuit components operatively arranged between said two entities. Thus, the term circuitally connected is not to be construed as requiring a direct ohmic connection of the first entity to the second entity (i.e., without any intervening circuit components) unless explicitly stated.

In some other embodiments, the control unit comprises a biasing circuit for biasing the plurality of pixels, and the dark current suppressing circuit comprises at least one reference element having a dark conductance that substantially matches the dark conductance of the photosensitive element of the pixels. The/each reference element is circuitally connected between a second intermediate terminal and a second biasing terminal, the second biasing terminal being circuitally connected to the biasing circuit. Moreover, the photosensitive element of each pixel is circuitally connected between the first intermediate terminal of said pixel and a first biasing terminal provided in said pixel, the first biasing terminal of each pixel being circuitally connected to the biasing circuit. In these embodiments, the biasing circuit is adapted to provide a biasing voltage between the first biasing terminal of the photosensitive element of the pixels of the plurality of pixels and the second biasing terminal of the at least one reference element. Additionally, the control unit is configured to, when a given pixel is to be read out, circuitally connect the first intermediate terminal of said pixel and the second intermediate terminal of a reference element of said at least one reference element with the output terminal of said pixel.

Similarly to what has been stated above regarding the meaning of the adjective "intermediate" in the terms "first intermediate terminal", said adjective has also been used to identify the above mentioned second intermediate terminal because that terminal is also a circuital element situated in an intermediate position in the image sensor (within the pixel or external to the pixel, depending on the embodiment), before the output terminal, and in this case serves the purpose of connecting the reference element with other components of the electrical circuit.

In this manner, the reference or blind element simulates the behavior of the photosensitive element of the pixels during the exposure cycle, enabling a balanced readout scheme of the photo-signal generated in the photosensitive element of the pixels by the incident light.

In accordance with the present invention, the dark conductance of a reference element substantially matches the dark conductance of the photosensitive element of the pixels if the dark conductance of the reference element does not differ from the dark conductance of the photosensitive element of the pixels by more than 25%, 20%, 15%, 15%, 10%, 8%, 5%, 3% or even 1%.

In these embodiments, the biasing voltage applied between the first biasing terminal of the photosensitive element of the pixels and the second biasing terminal of the at least one reference element is preferably a balanced voltage. That is, a first biasing voltage applied between said first biasing terminal and a reference terminal of the biasing circuit is symmetrical (i.e., same magnitude but opposite sign) to a second biasing voltage applied between said second biasing terminal and said reference terminal.

Then, by circuitally connecting the first intermediate terminal of said pixel and the second intermediate terminal of a reference element of said at least one reference element with the output terminal of said pixel, the differential voltage at the resulting node formed by the connection of the two intermediate terminals contains directly the photo-signal of said pixel.

Preferably, a reference element of the at least one reference element is arranged in said upper level and comprises a transport layer including at least one layer of a two-dimensional material. More preferably, said reference element further comprises a photosensitizing layer associated to the transport layer of said reference element.

As the structure of the reference element mimics that of the photosensitive elements of the pixels, it is possible to obtain in a simple manner a reference element with a dark conductance that accurately matches the dark conductance of the photosensitive elements.

In some embodiments, said reference element has the same geometry as the photosensitive element of the pixels but smaller transversal dimensions. In this way, the overhead in real estate due to the presence of the reference element is minimized without altering the dark conductance of said reference element, which must substantially match the dark conductance of the photosensitive elements.

In an embodiment the transversal dimensions of the at least one reference element are below the diffraction limit for the range of wavelengths of operation of the photosensitive element of the plurality of pixels. In this way, the at least one reference element does not block any light incident on the image sensor.

In some examples in which a reference element comprises a transport layer and a photosensitizing layer associated thereto, said reference element further comprises a first light-blocking layer disposed above the photosensitizing layer and the transport layer of said reference element.

The first light-blocking layer advantageously cover the photosensitizing layer and the transport layer of said reference element, ensuring that no photo-signal is generated in the reference element by light impinging on the image sensor. Otherwise, the dark conductance of said reference element would be undesirably modified and, hence, its ability to subtract the dark current component from the photo-signal generated at the photosensitive element of the pixels would be degraded.

More preferably, said reference element also comprises a second light-blocking layer disposed below the photosensitizing layer and the transport layer of said reference element.

The second light-blocking layer protects the photosensitizing layer and the transport layer of said reference element from light that could arrive through the layers of the lower level of the monolithic three-dimensional integrated circuit, as it could happen in those cases in which the image sensor comprises a transparent or partially transparent substrate.

In an embodiment, the first and/or second light-blocking layers take the form of a passivation layer, said passivation layer preferably comprising an oxide.

Alternatively, in other examples of such cases, the photosensitizing layer of said reference element is not sensitive in the range of wavelengths of operation of the photosensitive element of the plurality of pixels.

This results in a simpler reference element design because it eliminates the need for light-blocking layers, as the light impinging on said reference element cannot be absorbed by its photosensitive layer.

In the context of the present invention, a photosensitizing layer of a reference element is considered not to be sensitive in the range of wavelengths of operation of the photosensitive element of the plurality of pixels if the spectral absorbance of the photosensitizing layer of said reference element at any given wavelength within that range is smaller than a 25% of the lowest spectral absorbance of the photosensitive element for the range of wavelengths of operation.

Optionally, said reference element is arranged below the photosensitive element of a pixel of the plurality of pixels. Such an arrangement advantageously exploits the third dimension of the integrated circuit to obtain an even more compact architecture. Moreover, by disposing the reference element below the photosensitive element, light absorption by the transport layer and/or the photosensitizing layer of the reference element is further prevented.

However, in other embodiments said reference element is disposed on a same layer as the photosensitive element of a pixel.

Alternatively, a reference element of the at least one reference element may be arranged in said lower level and comprise a resistor. Such resistor may be a fixed resistor or, alternatively, a variable resistor (such as for instance an analog and/or digital variable resistor).

Said resistor can be advantageously implemented in the lower level of the monolithic three-dimensional integrated circuit using inexpensive silicon-based technologies, such as for instance CMOS technology. Furthermore, by taking one or more reference elements to the lower levels, more space on the upper level becomes available for the photosensitive element of the pixels.

In some cases, the upper level comprises one or more insulating layers associated to the photosensitive element of the plurality of pixels. In such cases, at least one pixel of the plurality of pixels may preferably comprise:
   a back-gate terminal disposed below the photosensitive element of said at least one pixel, between an insulating layer disposed below the photosensitive element of the plurality of pixels and the lower level of the monolithic three-dimensional integrated circuit; and/or
   a top-gate terminal disposed above the photosensitive element of said at least one pixel.

Preferably, said one or more insulating layers comprise an oxide.

In accordance with the present invention, an insulating layer associated to a photosensitive element preferably refers to the fact that the insulating layer is disposed above (such as for instance directly above) or alternatively below (such as for instance directly below) both the transport layer and the photosensitizing layer of said photosensitive element.

By providing a back-gate terminal and/or a top-gate terminal, the photosensitive element of the pixels can be gated to finely control the conduction and photosensitivity of the photosensitizing layer.

Preferably, the top-gate terminal is made of a transparent material, so as to not hinder the light absorption capabilities of the photosensitive element of the pixels.

In those cases in which a reference element of the at least one reference element comprises a transport layer, said reference element may also comprise a back-gate terminal disposed below its transport layer and/or a top-gate terminal disposed above its transport layer. More preferably, an insulation layer is provided between the transport layer of said reference element and the back-gate terminal (or the top-gate terminal).

The photosensitive element of each pixel comprises at its ends a drain contact and a source contact. The drain contact is circuitally connected to the first intermediate terminal of the pixel, while the source contact may be circuitally connected to the first biasing terminal of the pixel.

In some embodiments, the biasing circuit is further adapted to provide a voltage offset on both the source contact and the drain contact of the photosensitive element of the pixels. In such cases, a voltage at the source contact of the photosensitive element is preferably given by $V_{SRC}=V_{OFFSET}+V_{BIAS}$, while the voltage at the drain contact is preferably given by $V_{DRN}=V_{OFFSET}$. $V_{OFFSET}$ is the common-mode voltage, or voltage offset, applied to the drain and source contacts, while $V_{BIAS}$ is the voltage drop across the ends of the photosensitive element.

Similarly, in those cases in which a reference element of the at least one reference element comprises a transport layer, said reference element preferably comprises at its ends a drain contact and a source contact. In such cases, the biasing circuit may be further adapted to provide a voltage offset on both the source contact and the drain contact of said reference element in the same way as just described above for the photosensitive element.

Preferably, at least one pixel of the plurality of pixels comprises a conductive interconnect to couple the active device of said pixel to the photosensitive element of said pixel.

In some cases, the conductive interconnect comprises a vertical contact extending from the lower level to the upper level of the monolithic three-dimensional integrated circuit and having a first section connected to the active device of said pixel, said first section being disposed on the at least one semiconductor layer of said active device, and a second section ohmically connected to the transport layer of the photosensitive element of said pixel.

Such type of conductive interconnect is particularly advantageous when the active device of a pixel is in the perpendicular projection of the transport layer of the photosensitive element of said pixel. In these cases, the transport layer of said photosensitive element intersects the vertical contact perpendicularly at the second section, and a good ohmic connection can be obtained between the vertical contact and the at least one layer of a two-dimensional material comprised in the transport layer.

The first section and/or the second section may be at an end of the vertical contact or, alternatively, at an intermediate point of the vertical contact. In a preferred embodiment, the first section and the second section are at the opposite ends of the vertical contact.

Alternatively, in some other cases the conductive interconnect comprises a vertical contact extending from the lower level to the upper level of the monolithic three-dimensional integrated circuit and having a first section connected to the active device of said pixel, said first section being disposed on the at least one semiconductor layer of said active device; and a lateral contact arranged on said upper level and connected to a second section of the vertical contact. The lateral contact is ohmically connected to the transport layer of the photosensitive element of said pixel and comprises a portion being parallel to the transport layer of said photosensitive element.

The lateral contact makes it possible to overcome surface roughness, and even trenches on the surface of the integrated circuit, and establish a good electrical connection with the transport layer of the photosensitive elements in a more flexible manner, especially when the vertical contact of the conductive interconnect cannot be arranged underneath the transport layer of the photosensitive element of said pixel.

Preferably, said portion parallel to the transport layer of said photosensitive element is disposed directly above, directly below or coplanar to said transport layer. Such an arrangement facilitates, structurally and electrically, the connection of the lateral contact with the one or more layers of two-dimensional material comprised in the transport layer of the photosensitive element of the pixel.

The active device of each pixel of the plurality of pixels may comprise a switch, an amplifier, a filter, a digitizer, a level shifter and/or a storage element.

According to the present invention, the term active device preferably refers to a device comprising at least one transistor and requiring at least one control signal or a biasing voltage, regardless whether said device achieves any gain.

Embedding more electronics in each pixel may be preferred for those applications of the image sensor in which high bandwidth and throughput is required.

In some embodiments of the image sensor of the present invention, the plurality of pixels are grouped into clusters, each cluster comprising one or more pixels, with the photosensitizing layer of the photosensitive element of the one or more pixels of each cluster being sensitive to a different range of the spectrum.

This makes it possible to obtain an image sensor with an extended frequency range of operation, covering from X-ray photons and the ultraviolet (UV) to the infrared (IR), including near-infrared (NIR), short-wave infrared (SWIR), mid-wave infrared (MWIR) and long-wave infrared (LWIR), and even THz frequencies. It also allows implementing image sensors having multicolor pixels by, for example, tailoring the properties of the material selected for the photosensitizing layer.

Preferably, for at least one pixel of the plurality of pixels, the active device of said at least one pixel is operatively coupled to the first intermediate terminal of the photosensitive element of said at least one pixel. Such an interconnection scheme allows the active device to implement part or even all of the circuitry required to bring the photo-signal generated at the photosensitive element of a given pixel to the output terminal of said pixel.

In certain embodiments of the image sensor of the present invention, the plurality of pixels are arranged as a two-dimensional array comprising a plurality of rows and columns. Preferably, the rows and/or columns of the array are sequentially addressable.

In a first group of such embodiments, the dark current suppressing circuit comprises as many reference elements as there are columns in the array, each reference element being associated to the pixels of a different column; the active device of each pixel comprises a first switch configured to selectively connect the first intermediate terminal of the pixel to the second intermediate terminal of the reference element associated to the column of said pixel, and a second switch configured to selectively connect the first intermediate terminal of the pixel to its output terminal; and the readout circuit comprises:
  as many amplifiers as there are columns, each amplifier having an input terminal, circuitally connected to the output terminal of the pixels of a given column; and
  a storage element connected in series to an output terminal of each amplifier, each storage element being configured to store a voltage proportional to the photo-signal generated in a pixel of said given column.

Given that a same reference element and most of the readout circuitry is shared by the pixels of an entire column, the resulting pixel design in these embodiments is greatly simplified.

In a second group of such embodiments, the dark current suppressing circuit comprises a reference element arranged in each pixel of the plurality of pixels, each reference element having its second intermediate terminal connected to the first intermediate terminal of the pixel; and the active device of each pixel comprises a row-select switch connected to its output terminal.

Despite increasing the complexity of the pixel design, having a reference element in each pixel provides a better control to suppress the dark current generated by the photosensitive element of the pixels, as each reference element can be fine-tuned so that its dark conductance closely matches the dark conductance of the photosensitive element to which said reference element is associated.

In an embodiment of said second group, the row-select switch of the active device of each pixel is configured to selectively connect the output terminal of the pixel to its first intermediate terminal; and the readout circuit comprises:
  as many amplifiers as there are columns, each amplifier having an input terminal, circuitally connected to the output terminal of the pixels of a given column; and
  a storage element connected in series to an output terminal of each amplifier, each storage element being configured to store a voltage proportional to the photo-signal generated in a pixel of said given column.

Such an embodiment constitutes a good trade-off in terms of pixel design as the inclusion of the reference element into the pixel is counterbalanced with a simplified design of the active device of the pixels.

In an alternative embodiment of said second group, the active device of each pixel further comprises:

an amplifier having an input terminal, circuitally connected to the first intermediate terminal, and an output terminal; and
a storage element connected in series to the output terminal of the amplifier, the storage element being configured to store a voltage proportional to the photo-signal generated in the photosensitive element of the pixel; and
wherein the row-select switch is configured to selectively connect the output terminal of the pixel to the storage element.

In-pixel amplification makes the pixel more robust to noise and allows faster pixel readout, improving the scalability of the pixel array of the image sensor.

In some further embodiments of the image sensor according to the present invention, the dark current suppressing circuit comprises level shifters instead of reference elements. However, the topology of the readout circuit and the active device of the pixels are similar to those already discussed.

In a third group of such embodiments the dark current suppressing circuit comprises as many level shifters as there are columns in the array, each level shifter being associated to the pixels of a different column; the active device of each pixel comprises a first switch configured to selectively connect the first intermediate terminal of the pixel to the input node of the level shifter associated to the column of said pixel, and a second switch configured to selectively connect the output node of said level shifter to the output terminal of said pixel; and the readout circuit comprises:
as many amplifiers as there are columns, each amplifier having an input terminal, circuitally connected to the output terminal of the pixels of a given column; and
a storage element connected in series to an output terminal of each amplifier, each storage element being configured to store a voltage proportional to the photo-signal generated in a pixel of said given column.

In a fourth group of such embodiments, the dark current suppressing circuit comprises a level shifter arranged in each pixel of the plurality of pixels, each level shifter having its input node connected to the first intermediate terminal of the pixel; and the active device of each pixel comprises a row-select switch connected to its output terminal.

In an embodiment of said fourth group, the row-select switch of the active device of each pixel is configured to selectively connect the output terminal of the pixel to the output node of the level shifter comprised in said pixel; and the readout circuit comprises:
as many amplifiers as there are columns, each amplifier having an input terminal, circuitally connected to the output terminal of the pixels of a given column; and
a storage element connected in series to an output terminal of each amplifier, each storage element being configured to store a voltage proportional to the photo-signal generated in a pixel of said given column.

In an alternative embodiment of said fourth group, the active device of each pixel further comprises:
an amplifier having an input terminal, circuitally connected to the output node of the level shifter of said pixel, and an output terminal; and
a storage element connected in series to the output terminal of the amplifier, the storage element being configured to store a voltage proportional to the photo-signal generated in the photosensitive element of the pixel; and
wherein the row-select switch is configured to selectively connect the output terminal of the pixel to the storage element.

The control unit preferably includes an interconnection circuit (such as for example, but not limited to, a multiplexor) operatively connected to the readout circuit and that comprises a plurality of output nodes. The interconnection circuit allows circuitally connecting, through the readout circuit, the output terminal of any of the pixels of the array with one or more output nodes.

In some embodiments, the control unit comprises a post-amplification stage operatively connected to at least one output node of the plurality of output nodes of the interconnection circuit.

Optionally, the control unit further comprises a correlation double sampling stage operatively connected between said at least one output node of the interconnection circuit and the post-amplification stage. The correlation double sampling stage advantageously removes any undesired offset in the values detected from the photo-signals read out from the pixels and reduces readout noise components.

Also optionally, the control unit further comprises an analog-to-digital converter operatively connected after the post-amplification stage. In this way, the image sensor outputs can be directly interfaced with digital circuitry, such as for example a field-programmable gate array (FPGA), a digital signal processor (DSP), a microprocessor or a microcontroller.

For an embodiment, the response of the photosensitive element of the image sensor of the present invention is further enhanced by adding an element that concentrates the incoming light, on the face where the light impinges on the structure, i.e. a light-concentrating structure.

For different variants of said embodiment, said light-concentrating structure is a dielectric structure, or a metallic antenna or any type of plasmonic active element or plasmonic structure.

The plasmonic structure preferably is an antenna or a bull's eye metallic structure. By patterning the plasmonic structure it can be also possible to make pixels sensitive to a selected range of the light spectrum.

In some embodiments an insulating layer can be disposed above the photosensitive element and below the light-concentrating structure.

The plasmonic and dielectric structures disclosed herein are only examples not precluding other geometries of plasmonic and dielectric structures that may consist of metals, dielectrics, heavily doped semiconductors or graphene and related 2D materials, the choice of which is determined by the spectral range intended to be covered by the image sensor.

For a further embodiment, the response of the photosensitive element as described in the claims is further enhanced by adding a so-called microlens on top of each pixel.

For an embodiment, both the microlens and the plasmonic or dielectric structures are added to the photosensitive element, thus increasing even more its response.

The different insulating layers included in the image sensor of the present invention, and described above, are at least electrically insulating to avoid short-circuits.

Another aspect of the present invention relates to an optoelectronic system that comprises:
an image sensor according to the present invention (for any of the embodiments described in the present document);

an optical module operatively interfaced to the image sensor, the optical module being adapted to focus incoming light on the plurality of pixels;

a power supply module operatively connected to the control unit of the image sensor, the power supply module being configured to provide a biasing voltage to the image sensor;

an analog and/or digital control module operatively connected to the control unit of the image sensor, the analog and/or digital control module being configured to provide control signals to the control unit to selectively read out the pixels, and to receive a plurality of detected values corresponding to the photo-signals read out from the plurality of pixels by the readout circuit; and a peripheral module operatively connected to the analog and/or digital control module, the peripheral module being configured to process, store and/or render an image obtained from the plurality of detected values.

In some embodiments, the optoelectronic system of the present invention forms part of a camera, which can be used for day and/or night vision, photography, automotive applications, machine vision for inspection applications (such as for instance SWIR inspection of food or semiconductors), or surveillance, among other applications.

The image sensor and the optoelectronic system of the present invention can also be applied to spectrometry, thus constituting a spectrometer.

Yet another aspect of the present invention relates to a method for manufacturing an image sensor as a monolithic three-dimensional integrated circuit, wherein the image sensor comprises a plurality of pixels operatively connected to a control unit that includes a readout circuit for selectively reading out the photo-signals generated by the light impinging on the plurality of pixels, the method comprising the steps of:

a) providing at least one layer of semiconductor material on a substrate, said at least one layer of semiconductor material forming a lower level of the monolithic three-dimensional integrated circuit;

b) for each pixel of the plurality of pixels, arranging an active device at a selected location of the at least one layer of semiconductor material of said lower level, and providing an output terminal to the pixel;

c) arranging at least a part of the control unit in said lower level, and circuitally connecting the output terminal of each pixel to the readout circuit of the control unit;

d) providing a transport layer including at least one layer of a two-dimensional material, and a photosensitizing layer associated to the transport layer, the transport layer and the photosensitizing layer forming an upper level of the monolithic three-dimensional integrated circuit, said upper level being disposed above said lower level;

e) for each pixel of the plurality of pixels, arranging a photosensitive element at a selected location of said upper level, and circuitally connecting the photosensitive element to a first intermediate terminal being provided in said pixel;

f) operatively coupling the photosensitive element of each pixel to the active device of said pixel; and g) providing a dark current suppressing circuit configured to substantially suppress the dark current generated by the photosensitive element of the pixels during an exposure cycle.

Moreover, the control unit is configured to, when a given pixel is to be read out, circuitally connect the first intermediate terminal of said pixel with the output terminal of said pixel through the dark current suppressing circuit.

In some preferred embodiments, the control unit further includes a biasing circuit for biasing the plurality of pixels, and the dark current suppressing circuit comprises at least one reference element having a dark conductance that substantially matches the dark conductance of the photosensitive element of the pixels. In such embodiments, the method further comprises the steps of:

for each pixel of the plurality of pixels, circuitally connecting the photosensitive element between the first intermediate terminal and a first biasing terminal being provided in said pixel;

circuitally connecting the/each reference element between a second intermediate terminal and a second biasing terminal being provided in the monolithic three-dimensional integrated circuit; and circuitally connecting the first biasing terminal of each pixel of the plurality of pixels and the second biasing terminal of the at least one reference element to the biasing circuit.

Additionally, in these embodiments, the control unit is configured to, when a given pixel is to be read out, circuitally connect the first intermediate terminal of said pixel and the second intermediate terminal of a reference element of said at least one reference element with the output terminal of said pixel.

In some embodiments, the method further comprises the step of providing an encapsulation layer above the transport layer and the photosensitizing layer. In this manner, the photosensitive elements of the pixels are advantageously protected.

BRIEF DESCRIPTION OF THE FIGURES

In the following some preferred embodiments of the invention will be described with reference to the enclosed figures. They are provided only for illustration purposes without however limiting the scope of the invention.

DESCRIPTION OF THE PREFERRED EMBODIMENTS

Figure 1A:
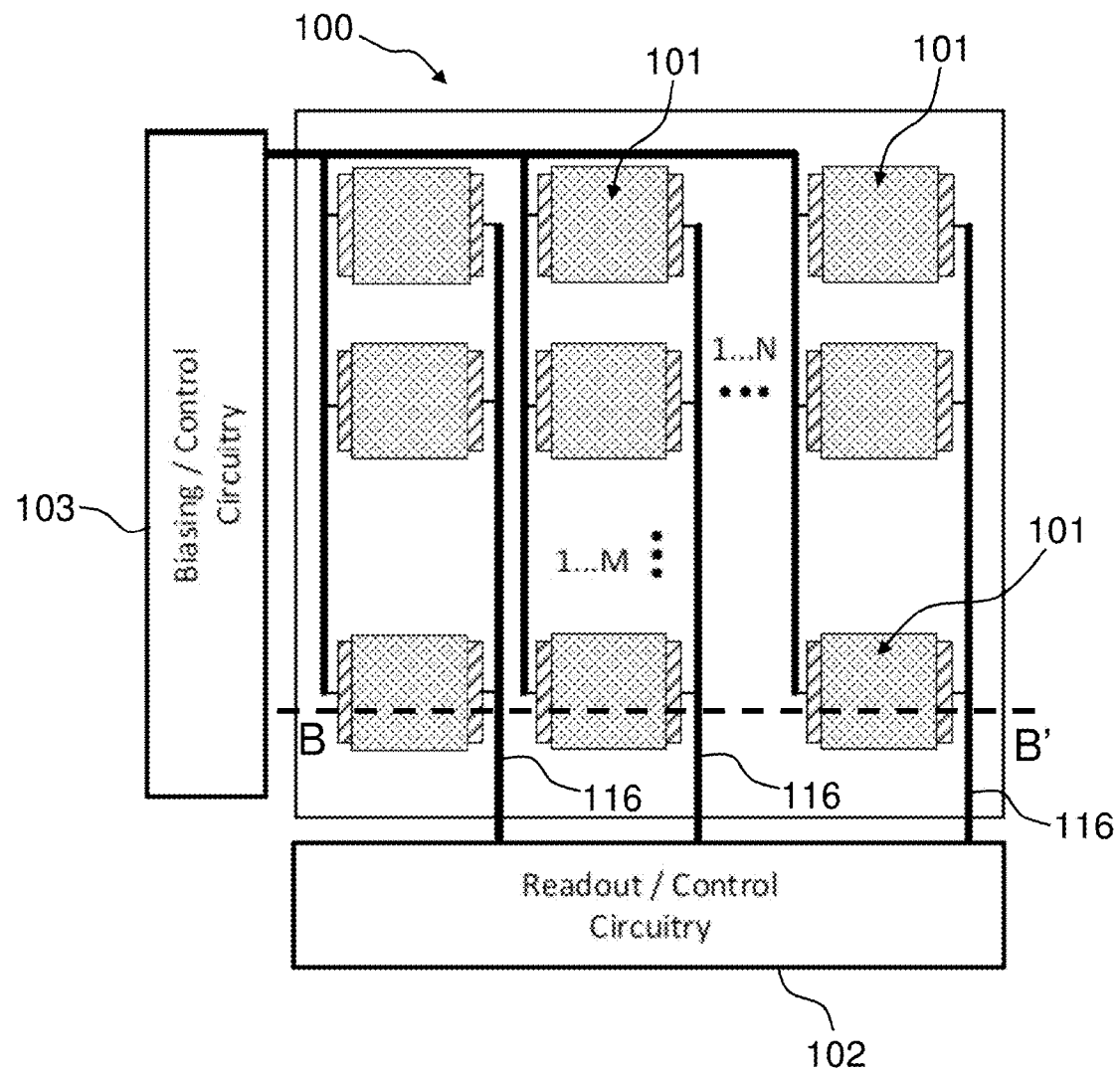
FIG. 1a is a top plan view of a block diagram of an exemplary image sensor according to the present invention.

In FIG. 1a it is illustrated a top plan view of a block diagram of an embodiment of the image sensor according to present invention. In particular the image sensor 100 comprises a plurality of pixels 101 arranged as a two-dimensional array of M rows and N columns. The plurality of pixels 101 are operatively connected to a control unit that includes a biasing circuit 103 for biasing the plurality of pixels 101 and a readout circuit 102 for selectively reading out the photo-signals generated by the light impinging on the plurality of pixels 101.

Figure 1B:
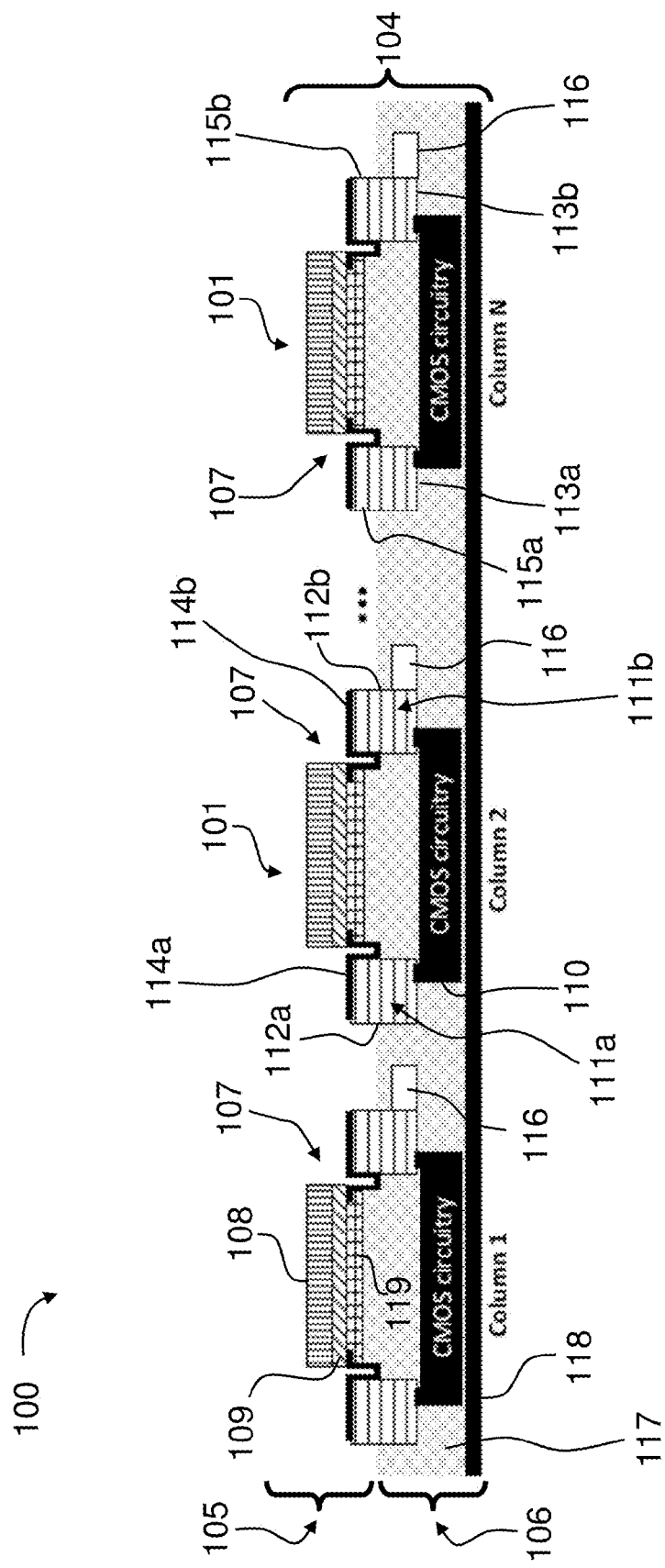
FIG. 1b corresponds to a cross-sectional view of the image sensor of FIG. 1a along a line B-B'.

As it can be better seen in the cross-sectional view of FIG. 1b, the image sensor 100 comprises a monolithic three-dimensional integrated circuit 104 comprising an upper level 105 having a first plurality of stacked layers and a lower level 106, disposed underneath the upper level, having a second plurality of stacked layers.

Each pixel 101 of the plurality of pixels comprises a photosensitive element 107 arranged at a selected location of said upper level 105 (in particular there are three pixels 101 fully represented in FIG. 1b). The photosensitive element 107 comprises a photosensitizing layer 108 associated to a transport layer 109 that includes at least one layer of a two-dimensional material. In this example the photosensitizing layer 108 is disposed above (and in particular, directly above) the transport layer 109. However, in other examples the photosensitizing layer can be below the transport layer of the photosensitive element of the pixels.

In addition, each pixel 101 also comprises an active device 110 arranged at a selected location of said lower level 106. The active device 110 comprises at least one layer of a semiconductor material (e.g., silicon) and is operatively coupled to the photosensitive element 107. Although the active device 110 in the example illustrated in FIG. 1b is made using CMOS technology, other manufacturing technologies known in the state of the art can be equally used. Finally, each pixel 101 comprises a first intermediate terminal circuitally connected to the photosensitive element 107 and an output terminal circuitally connected to the readout circuit 102.

The monolithic three-dimensional integrated circuit 104 includes a CMOS substrate 118 disposed at the bottom of the lower level 106, and an insulating layer 119 arranged below the transport layer 109 to separate the photosensitive element 107 from a CMOS dielectric stack 117.

The image sensor 100 further comprises a dark current suppressing circuit configured to substantially suppress the dark current generated by the photosensitive element 107 of the pixels 101 during an exposure cycle. In that sense, the control unit of the image sensor 100, which is arranged in part in said lower level 106, is configured to, when a given pixel 101 is to be read out, circuitally connect the first intermediate terminal of said pixel 101 with the output terminal of said pixel 101 through the dark current suppressing circuit.

Each pixel 101 comprises two conductive interconnects 111a, 111b to couple the active device 110 of said pixel to the photosensitive element 107 of said pixel. The conductive interconnects 111a, 111b implement, respectively, the source contact and the drain contact of the photosensitive element 107.

The conductive interconnects 111a, 111b comprise a vertical contact 112a, 112b (e.g., a via) extending from the lower level 106 to the upper level 105 of the monolithic three-dimensional integrated circuit 104 and having a first section 113a, 113b (in the present example the lower end of the vertical contacts 112a, 112b) connected to the active device 110 of said pixel. The first sections 113a, 113b are disposed on the at least one semiconductor layer of said active device 110. The conductive interconnects 111a, 111b also include lateral contacts 114a, 114b to interface properly with the layer of two-dimensional material of the transport layer 109. Said lateral contacts 114a, 114b are arranged on the upper level 105 and connected to a second section 115a, 115b of the vertical contact (in this example, the upper end of the vertical contacts 112a, 112b). The lateral contacts 114a, 114b can be deposited on the insulating layer 119 by sputtering or by means of any other known deposition technique, and are ohmically connected to the transport layer 109 of the photosensitive element 107 of said pixel by means of a portion that is disposed directly below and parallel to the transport layer 109 of said photosensitive element 107.

The readout circuit 102 comprises a plurality of metal tracks 116 that run parallel to the columns of pixels 101 of a plurality of columns. Each metal track 116 is connected to the output terminal of the pixels 101 of a given column. As it can be seen in FIG. 1b, the metal tracks 116 are provided in the CMOS dielectric stack 117 comprised in the lower level 106. Each metal track 116 is connected to the vertical contact 112b of the conductive interconnect 111b, which in this particular example is the output terminal of the pixel 101.

FIGS. 2a-2f provide further examples of pixels suitable for the image sensor 100, showing different alternatives on how to couple the active device of the pixel to the transport layer of its photosensitive element. For simplicity, elements in common with the pixel structure of FIG. 1b have been labeled with the same reference numerals.

Figure 2A:
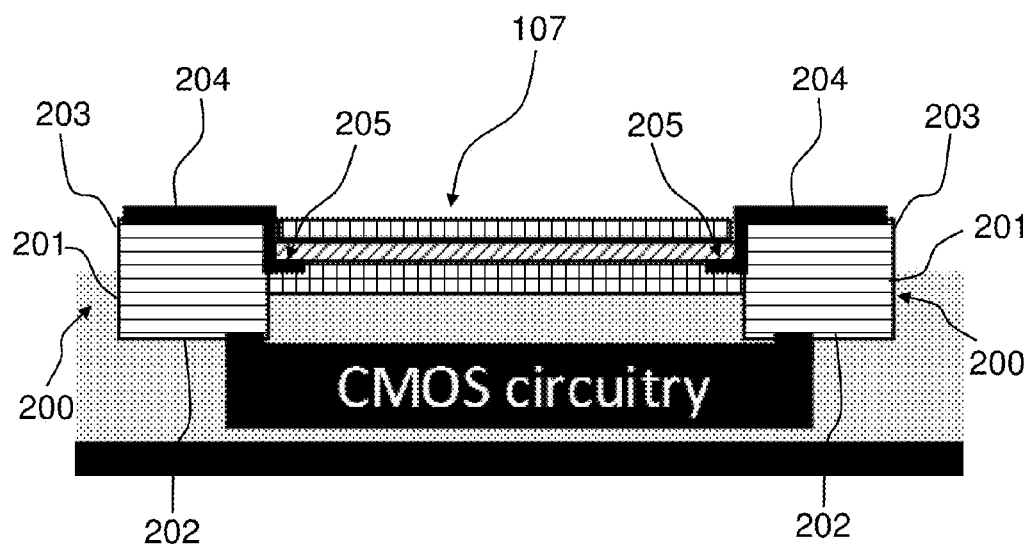
FIGS. 2a-2f are cross-sectional views of a pixel of an image sensor according to the present invention that comprises two conductive interconnects to couple the active device of the pixel to the transport layer of the photosensitive element of said pixel, in which: (a) the conductive interconnects comprise a lateral contact with a portion disposed directly below and parallel to the transport layer; (b) the conductive interconnects comprise a lateral contact with a portion disposed coplanar to the transport layer; (c) the conductive interconnects comprise a lateral contact with a portion disposed directly above and parallel to the transport layer; (d) the conductive interconnects comprise a lateral contact with a portion above and parallel to the transport layer and an additional vertical portion; (e) the conductive interconnects comprise a vertical contact with an end disposed directly below and ohmically connected to the transport layer; (f) the conductive interconnects comprise a vertical contact ohmically connected to the transport layer at an intermediate point of the vertical contact.

The configuration shown in FIG. 2a is equivalent to that of FIG. 1b, as the conductive interconnects 200 disposed at both ends of the photosensitive element 107 comprise a vertical contact 201 extending from the lower level to the upper level of the monolithic three-dimensional integrated circuit and having a first end 202 disposed on the at least one semiconductor layer of the active device 110 and connected to said active device 110. The conductive interconnects 200 further comprise a lateral contact 204 arranged on the upper level and connected to a second end 203 of the vertical contact 201. The lateral contacts 204 are ohmically connected to the transport layer 109 of the photosensitive element 107 of the pixel and comprise a portion 205 disposed directly below and parallel to the transport layer 109 of the photosensitive element 107.

Figure 2B:
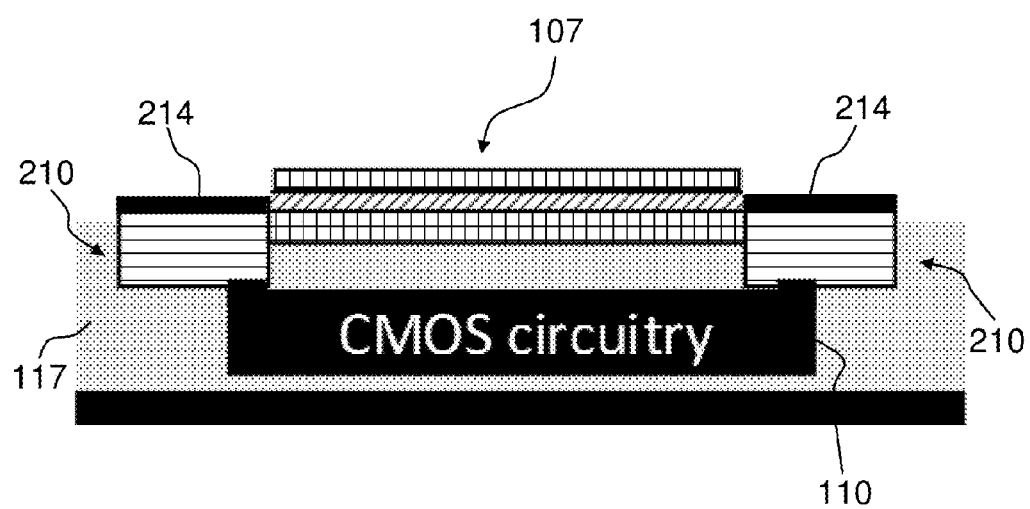
Figure 2C:
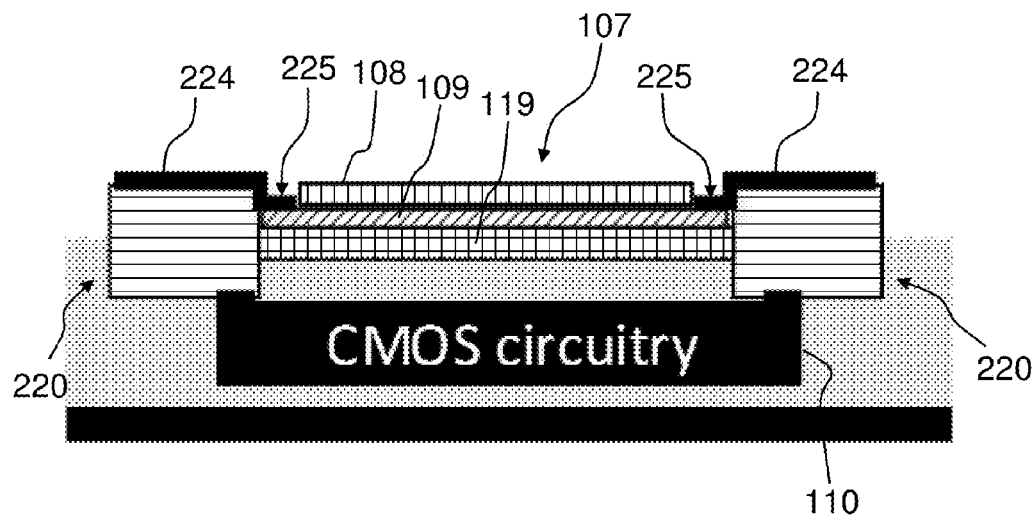

FIG. 2b depicts an alternative example in which two conductive interconnects 210 comprise lateral contacts 214 connected to the second end 203 of the vertical contacts 201, and that are coplanar to the transport layer 109 and, hence, ohmically connected to the sides of transport layer 109. In FIG. 2c it is illustrated the case in which two conductive interconnects 220 have lateral contacts 224 ohmically connected to the transport layer 109 of the photosensitive element 107 and comprise a portion 225 disposed directly above and parallel to the transport layer 109.

Figure 2D:
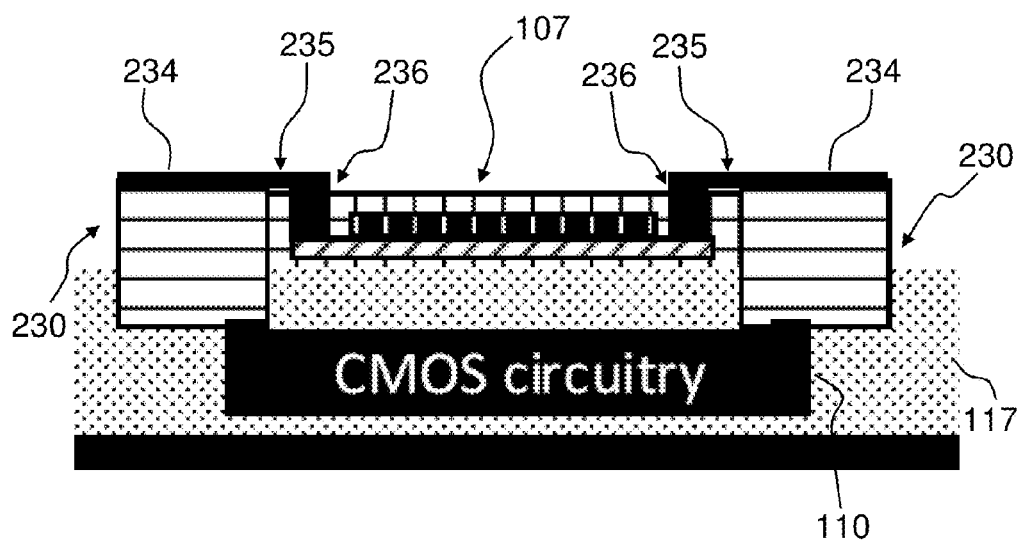

FIG. 2d provides a variation to the example of FIG. 2c, in which the conductive interconnects 230 comprise a lateral contact 234 connected to an upper end of the vertical contacts 201. As in the case of FIG. 2c, the lateral contacts 234 comprise a portion 235 disposed above and parallel to the transport layer 109. However, the portion 235 is now arranged at a distance from the transport layer 109. To establish ohmic contact with the transport layer 109, the lateral contacts 234 further comprise an additional vertical portion 236 that connects the parallel portion 235 with the transport layer 109.

Figure 2E:
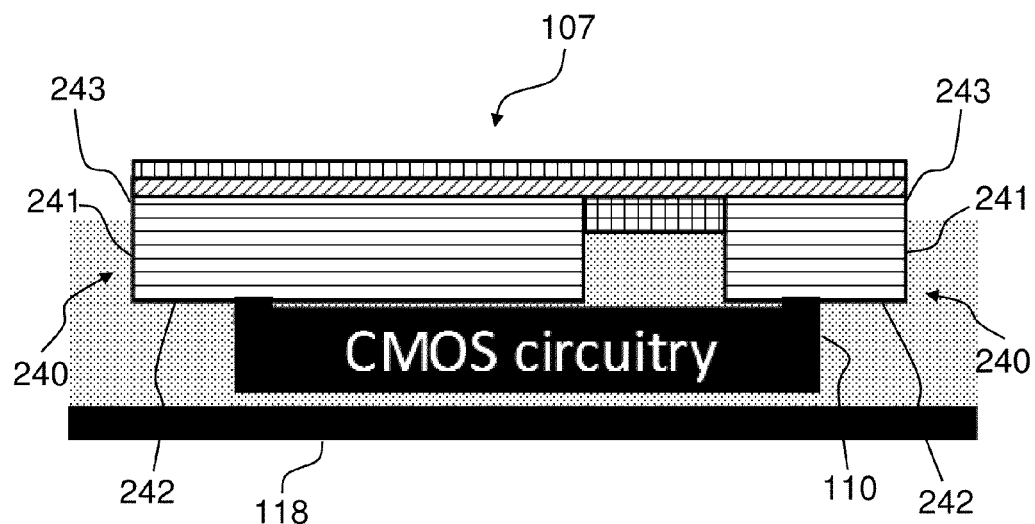

A further example is illustrated in FIG. 2e, in which a pixel comprises two conductive interconnects 240 disposed at the ends of its photosensitive element 107. Each conductive interconnect 240 comprises a vertical contact 241 extending from the lower level 106 to the upper level 105 of the monolithic three-dimensional integrated circuit 104. The vertical contact 241 has a first section 242 (i.e., lower end of vertical contact 241) disposed on the at least one semiconductor layer of the active device 110 of the pixel and connected to said active device 110, and a second section 243 (i.e., upper end of vertical contact 241) ohmically connected to the transport layer 109 of the photosensitive element 107. That is, in this example the conductive interconnects 240 are below the transport layer 109.

It can also be observed in FIG. 2e that the vertical contacts 241 of the conductive interconnects 240 have different transversal dimensions. However, in other examples they could have the same transversal dimensions.

Figure 2F:
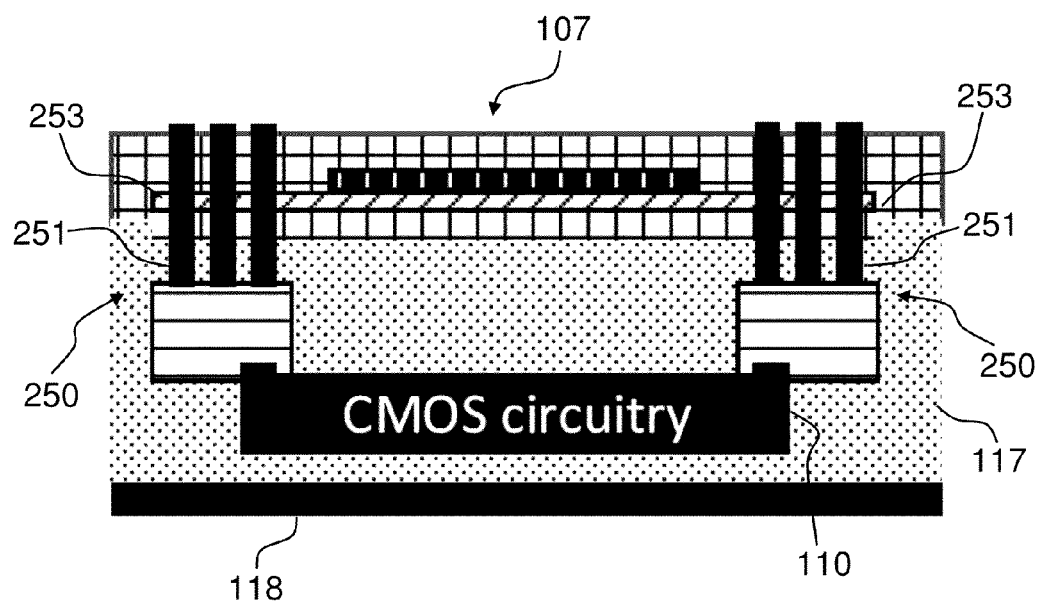

FIG. 2f shows a slight variation with respect to the example of FIG. 2e. Each of the two conductive interconnects 250 comprises vertical contact 251 that is intersected by the transport layer 109 of the photosensitive element 107. That is, in this example the second section 253 of the vertical contact 251 is provided at an intermediate point rather than at the upper end of the vertical contact 251.

Figure 2G:
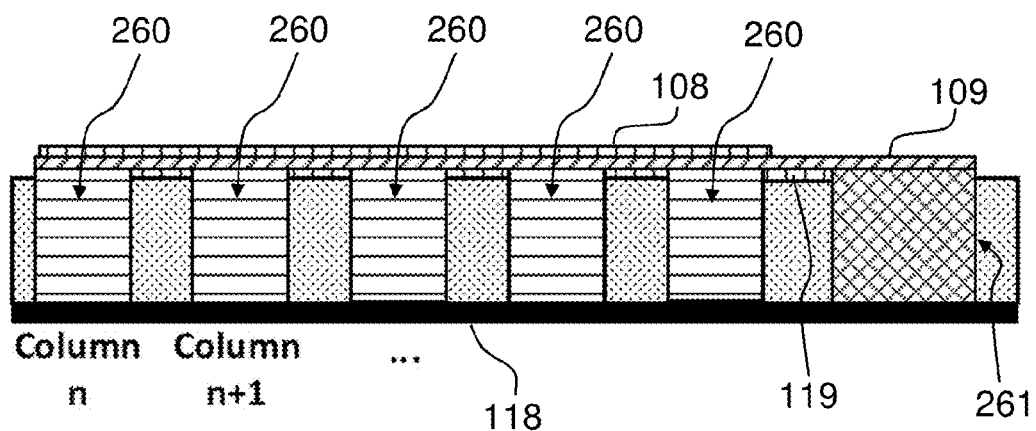
FIG. 2g depicts, in a cross-sectional view, an alternative to the embodiment shown in FIG. 1b in which the photosensitive elements of a row of pixels share a common source contact.

Alternatively to the arrangement shown in FIG. 1b, the photosensitive elements of a row of pixels may share a common source contact (see FIG. 2g), so that each photosensitive element is defined in the area between a different drain contact (implemented by each conductive interconnect 260) and the common source contact (implemented by the conductive interconnect 261). In this way, the total number of conductive interconnects required for the two-dimensional array of pixels is greatly reduced.

The geometry of the photosensitive elements can be defined via patterning of the transport layer, which allows either maximizing the light-collection area or tailoring specific aspect ratios for the optimization of different performance parameters (such as for instance, but not limited to, noise, responsivity, and resistance).

Figure 3:
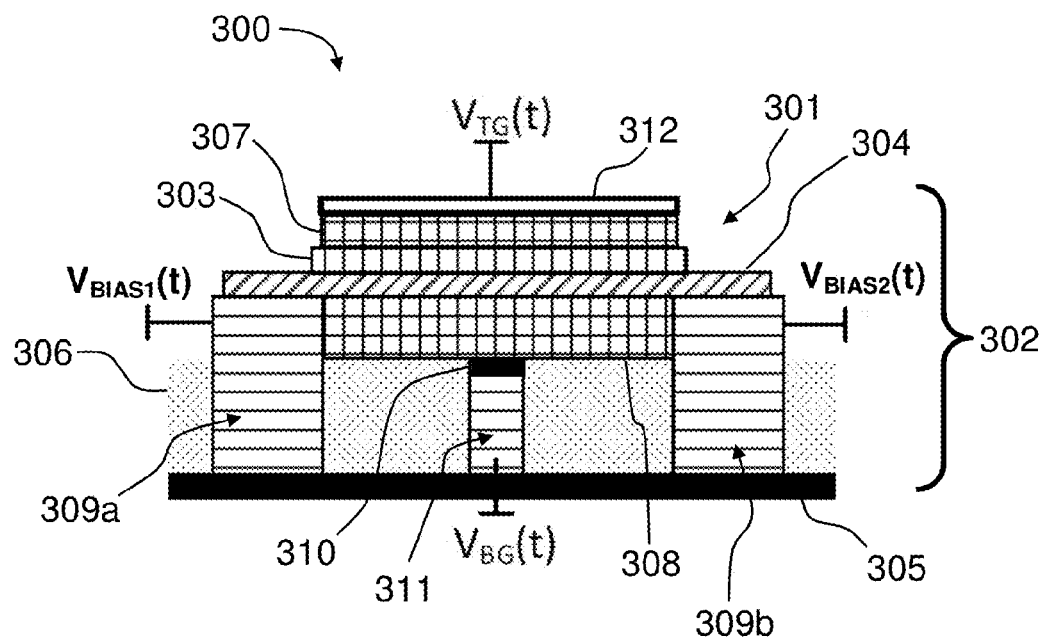
FIG. 3 is a cross-sectional view of a pixel for an image sensor according to the present invention, in which the pixel comprises a back-gate terminal and a top-gate terminal.

Referring now to FIG. 3, it is there shown a cross-sectional view of a pixel suitable for an image sensor according to the present invention. In particular, the pixel 300 comprises a photosensitive element 301 arranged on the upper level of a monolithic three-dimensional integrated circuit 302. The photosensitive element 301 comprises a photosensitizing layer 303 associated to a transport layer 304, which is disposed below the photosensitizing layer 303 and includes a layer of a two-dimensional material. In a lower level of the monolithic three-dimensional integrated circuit 302 there are a plurality of layers including a semiconductor substrate 305 and a dielectric stack 306.

The upper level further comprises a first insulating layer 307 and a second insulating layer 308 comprising an oxide and associated to the photosensitive element 301. Specifically, the first insulating layer 307 is disposed above the photosensitizing layer 303, while the second insulating layer 308 is disposed below the transport layer 304 and isolates the photosensitive element 301 from the dielectric stack 306 of said lower level.

The pixel comprises two conductive interconnects 309a, 309b at the opposite ends of the transport layer 304 that implement, respectively, the source and drain contacts of the photosensitive element 301. When the photosensitive element 301 is operated as a two-terminal device, a biasing voltage (generally a time-dependent signal) is applied between the source and drain contacts.

The pixel 300 also comprises a back-gate terminal 310 disposed below the photosensitive element 301, between the second insulating layer 308 and the lower level of the monolithic three-dimensional integrated circuit 302. The back-gate terminal 310 is connected to a vertical contact 311 to make it accessible through the semiconductor substrate 305. In addition, the pixel 300 includes a top-gate terminal 312 made of a transparent material and disposed above the photosensitive element 301. The first insulating layer 307 acts as spacer separating the top-gate terminal 312 from the photosensitizing layer 303.

Figure 4:
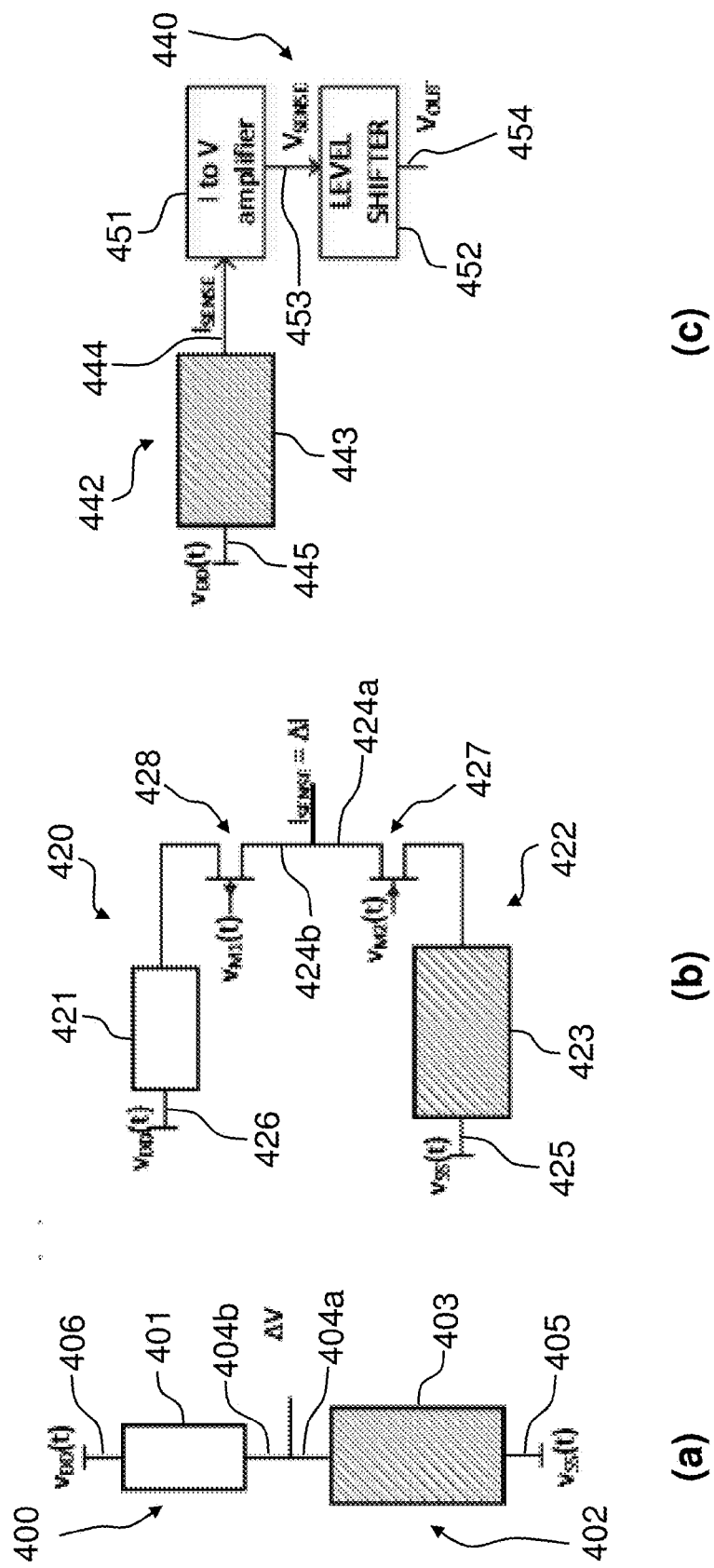
FIG. 4 illustrates three different examples of a dark current suppressing circuit of the image sensor of the present invention, the dark current suppressing circuit being circuitally connected to the photosensitive element of a pixel, in which: (a) the dark current suppressing circuit comprises a reference element that is directly connected to the photosensitive element of the pixel; (b) the dark current suppressing circuit comprises a reference element that is connected to the photosensitive element of the pixel through a current skimming circuit; and (c) the dark current suppressing circuit comprises a level shifter cascaded to a transimpedance amplifier, and is connected in series with the photosensitive element of the pixel.

FIGS. 4a-c represent some possible configurations for the dark current suppressing circuit comprised in the image sensor 100, when circuitally connected to the photosensitive element of a given pixel.

The example of FIG. 4a shows a balanced scheme, in which the dark current suppressing circuit 400 comprises a reference element 401 having a dark conductance that substantially matches the dark conductance of the photosensitive element 403 of the pixel 402.

The photosensitive element 403 of the pixel 402 is circuitally connected between the first intermediate terminal 404a of said pixel and a first biasing terminal 405 provided in said pixel and circuitally connected to the biasing circuit 103. Moreover, the reference element 401 is circuitally connected between a second intermediate terminal 404b and a second biasing terminal 406 circuitally connected to the biasing circuit 103. In this example, the biasing circuit 103 is adapted to provide a balanced biasing voltage between the first biasing terminal 405 and the second biasing terminal 406.

In this example, the control unit is configured to, when the pixel 402 is to be read out, circuitally connect the first intermediate terminal 404a and the second intermediate terminal 404b (which form a same node) with the output terminal of the pixel 402. Because of the applied balanced biasing voltage, the differential voltage at the resulting node formed by the connection of the two intermediate terminals 404a, 404b contains directly the photo-signal of said pixel 402.

FIG. 4b is a variation of the dark current suppressing circuit depicted in FIG. 4a including a current skimming circuit. As in the previous example, the dark current suppressing circuit 420 comprises a reference element 421 having a dark conductance that substantially matches the dark conductance of the photosensitive element 423 of a pixel 422.

The photosensitive element 423 has an end connected to a first intermediate terminal 424a through a first skimming transistor 427, and an opposite end connected to a first biasing terminal 425 circuitally connected to the biasing circuit 103. Similarly, the reference element 421 has an end connected to a second intermediate terminal 424b through a second skimming transistor 428, and an opposite end connected to a second biasing terminal 426 circuitally connected to the biasing circuit 103.

The biasing circuit 103 is adapted to provide a balanced biasing voltage between the first biasing terminal 425 and the second biasing terminal 426. Moreover, the control unit is adapted to provide appropriate control signals to the first and second skimming transistors 427, 428 to suppress the dark current generated by the photosensitive element 423.

An alternative dark current suppressing circuit is represented schematically in FIG. 4c. The dark current suppressing circuit 440 comprises a level shifter 452 adapted to subtract a voltage level that is substantially equal to the voltage level generated by the dark current of the photosensitive element 443 of the pixel 442 during an exposure cycle. The level shifter 452 is cascaded to a transimpedance amplifier 451, which is connected in series with the photosensitive element 443. In this case, the control unit is configured to, when the pixel 442 is to be read out, connect the first intermediate terminal 444 of the photosensitive element 443 with an input node 453 of the level shifter 452 through the transimpedance amplifier 451 and the output terminal of said pixel with an output node 454 of the level shifter 452.

In those examples in which the dark current suppressing circuit comprises a reference element that can be circuitally connected to the photosensitive element of a pixel, said reference element can be implemented in different ways.

Figure 5:
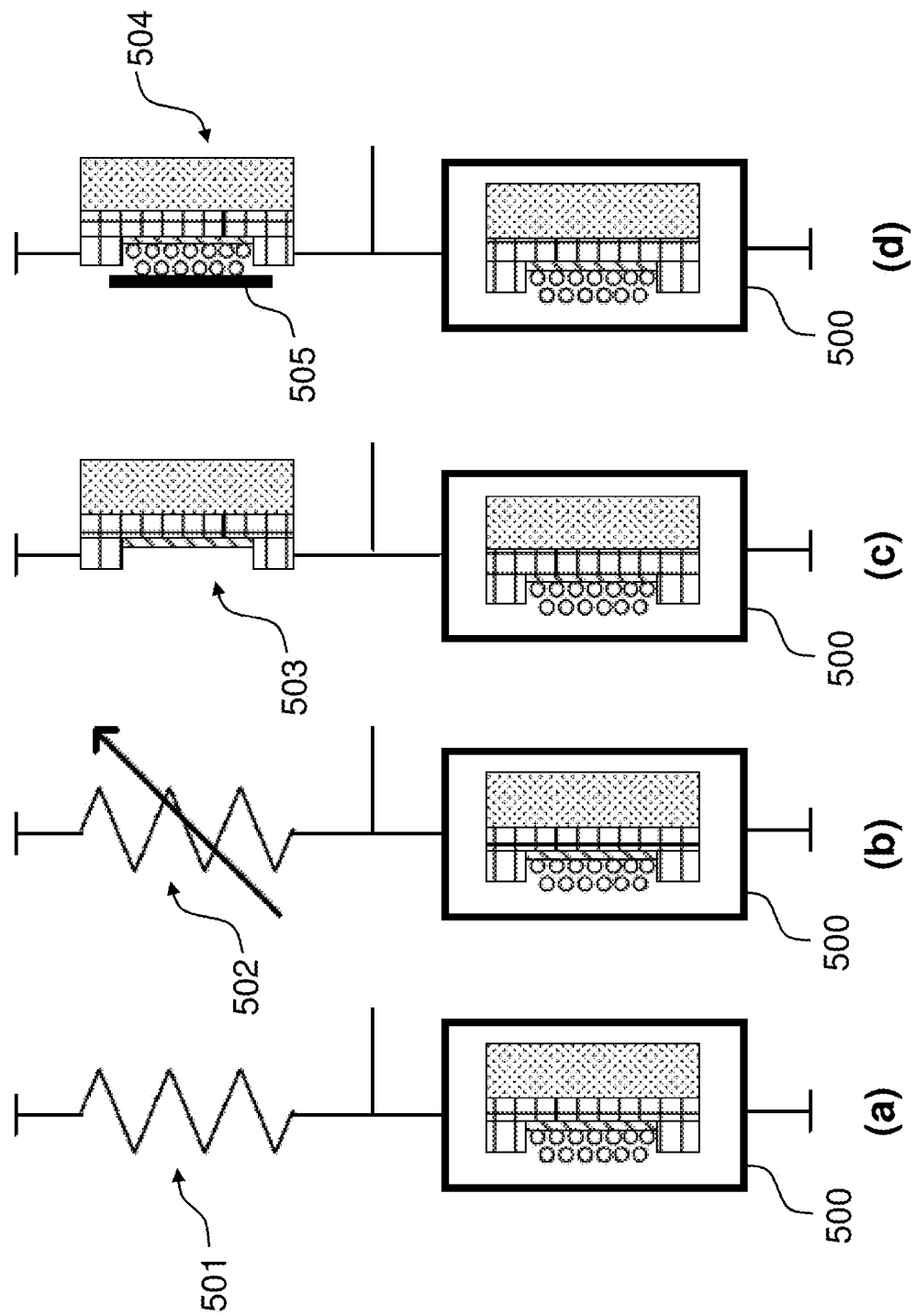
FIG. 5 shows four different examples of a reference element comprised in an image sensor according to the present invention, the reference element being circuitally connected to the photosensitive element of a pixel: (a) the reference element is a fixed resistor; (b) the reference element is a variable resistor; (c) the reference element comprises a transport layer without any photosensitizing layer associated thereto; and (d) the reference element comprises a transport layer, a photosensitizing layer associated thereto and a first light-blocking layer.

In some cases, such as illustrated in FIGS. 5a and 5b, a reference element is either a fixed resistor 501, or a variable resistor 502, circuitally connected to a photosensitive element 500.

In some other cases (FIG. 5c), a reference element 503 is arranged in the upper level of the monolithic three-dimensional integrated circuit and comprises a transport layer including a layer of a two-dimensional material without any photosensitizing layer associated thereto.

FIG. 5d shows a further example in which the reference element is structurally equivalent to a photosensitive element. In particular, reference element 504 comprises a transport layer associated to a photosensitizing layer. The reference element 504 further comprises a first light-blocking layer 505 disposed above its photosensitizing layer. The first light-blocking layer 505 is a passivation layer comprises an oxide.

Although the example of FIG. 5d comprises only one light-blocking layer, the reference element 504 could additionally comprise a second light-blocking layer disposed below its transport layer to prevent the absorption of light passing through the substrate of the lower level of the monolithic three-dimensional integrated circuit on which the reference element 504 is laid out.

Figure 6:
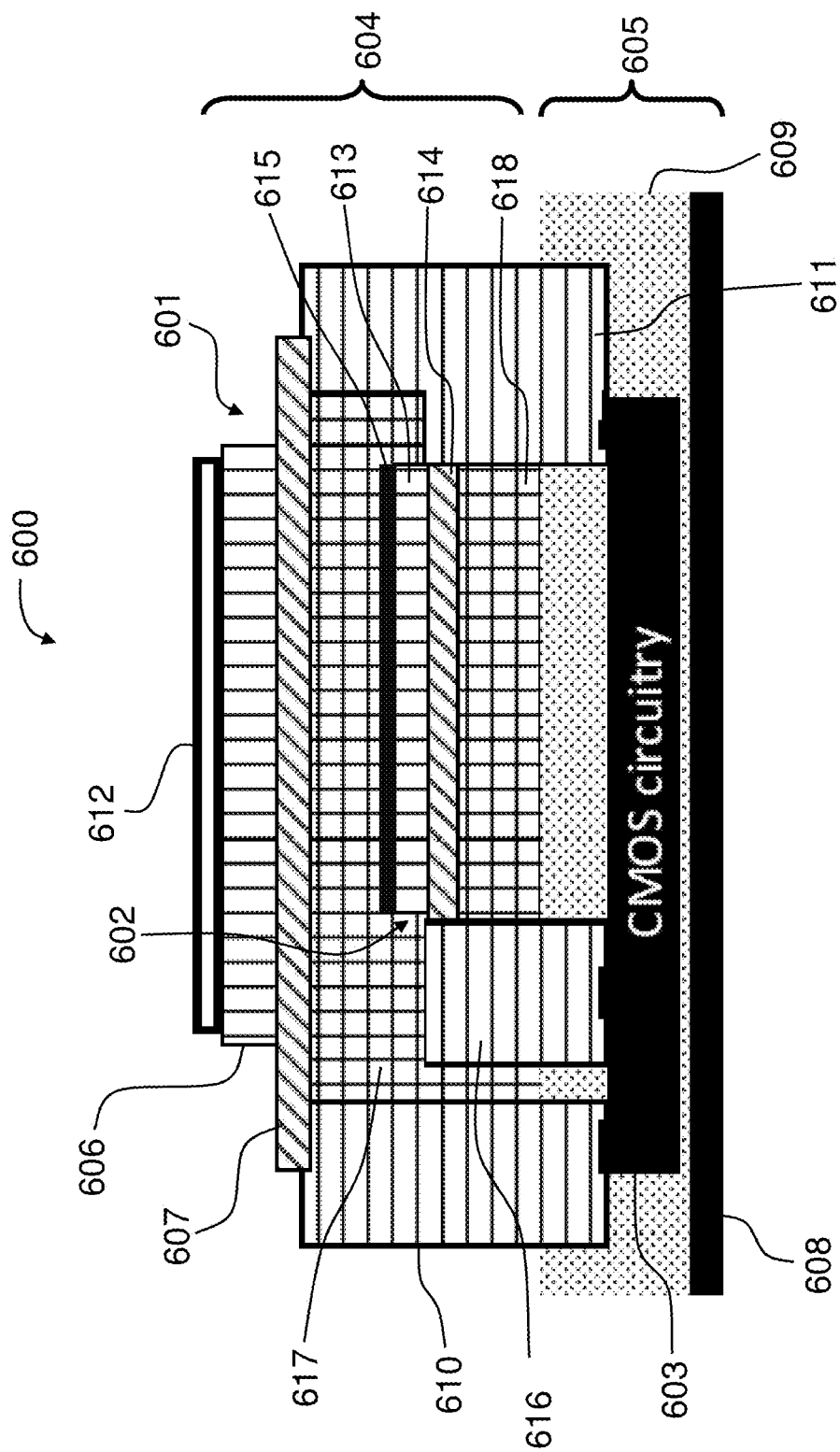
FIG. 6 corresponds to a cross-sectional view of a pixel suitable for an image sensor in accordance with the present invention, in which the pixel comprises a reference element arranged below the photosensitive element of the pixel.

When the reference element or elements of a dark current suppressing circuit are arranged in the upper level of a monolithic three-dimensional integrated circuit, rather than being disposed on the same layer as the photosensitive elements of the pixels, they can be advantageously arranged below the photosensitive elements, as it is represented in the cross-sectional view of a pixel of FIG. 6.

A pixel 600 comprises a photosensitive element 601 and an active device 603 arranged, respectively, in the upper level 604 and the lower level 605 of a monolithic three-dimensional integrated circuit. The photosensitive element 601 comprises a photosensitizing layer 606 disposed above a transport layer 607 to which is associated. A transparent top-gate terminal 612 is provided above the transport layer 607 to finely adjust the electrical parameters of the photosensitive element 601.

The bottom level 605 comprises a substrate 608 on which a CMOS dielectric stack 609 is disposed. The active device 603 comprises at least one layer of a semiconductor material embedded in the CMOS dielectric stack 609, which is coupled to the photosensitive element 601 by means of two conductive interconnects 610, 611 that contact the transport layer 607 at two opposite ends, implementing respectively the source and drain contacts of the photosensitive element 601.

A reference element 602 has been implemented inside the pixel 600, arranged in the upper level 604 between the transport layer 607 of the photosensitive element 601 and the CMOS dielectric stack 609. The reference element 602 comprises a second photosensitizing layer 613 sandwiched between a second transport layer 614 and a light-blocking layer 615, disposed respectively below and above the second photosensitizing layer 613. The coupling of the reference element 602 to the active device 603 is done by means of a conductive interconnect 616, which implements the source contact for said reference element 602, and conductive interconnect 611, which is shared with the photosensitive element 601 and implements the drain contact for said reference element 602.

The structure of the pixel 600 is completed with a first insulating layer 617 to isolate the photosensitive element 601 from the reference element 602, and a second insulating layer 618 to isolate the reference element 602 from the CMOS dielectric stack 609.

The design of the readout circuit of the control unit, and that of the active device of the pixels of the image sensor, can take different forms depending on how much of the processing of the photo-signal generated by the photosensitive element of the pixels is carried out locally at the pixel level.

Figure 7A:
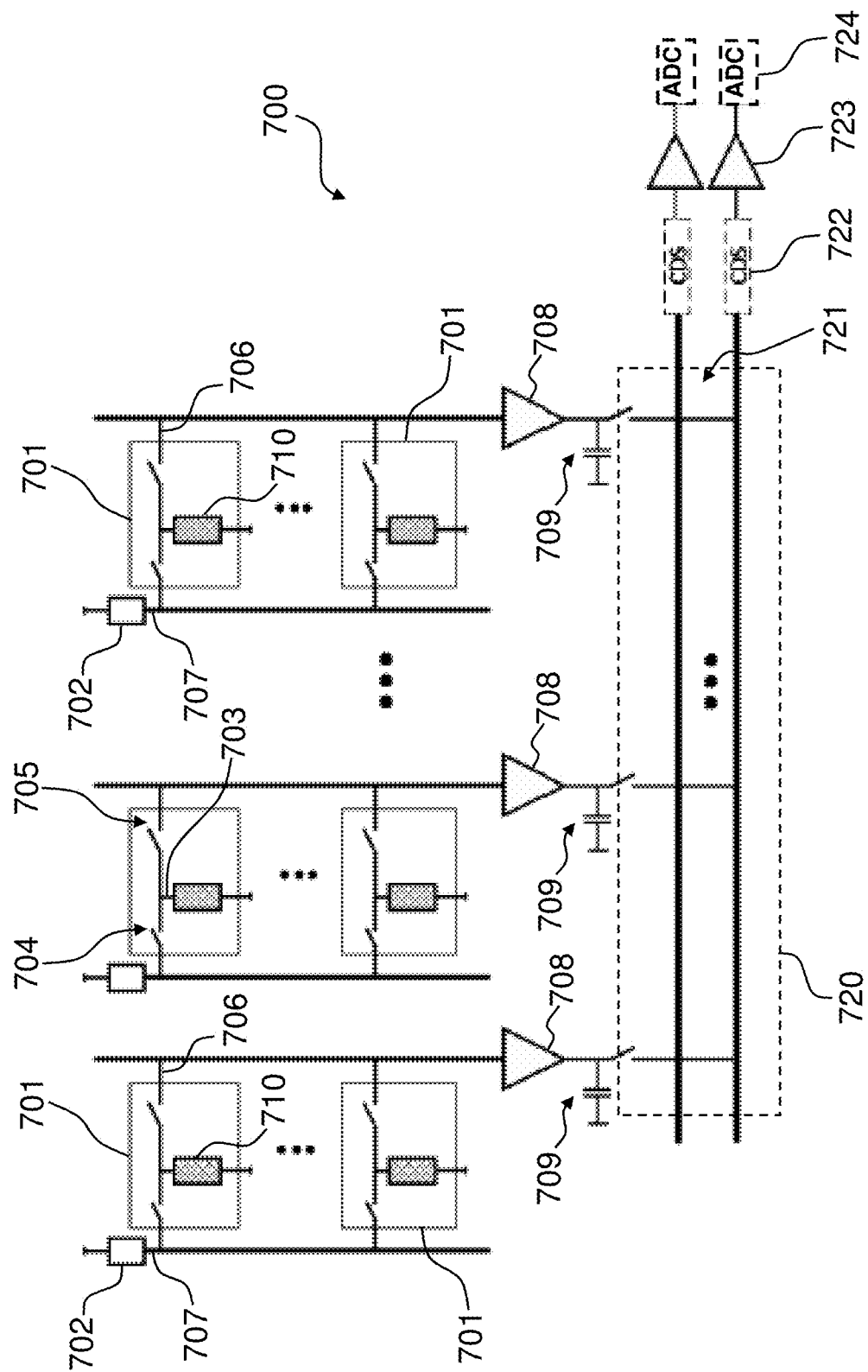
FIG. 7a shows a schematic block diagram of an embodiment of an image sensor according to the present invention in which a same reference element and a same amplifier cascaded to a storage element is shared by several pixels.

FIG. 7a shows a first example of an image sensor in which a same reference element is shared by several pixels. In particular, the image sensor 700 comprises a plurality pixels 701 arranged as a two-dimensional array with a number of rows and columns. The image sensor 700 includes a dark current suppressing circuit comprising as many reference elements 702 as there are columns in the array, so that each reference element 702 is associated to the pixels 701 of a different column. Moreover, each reference element 702 is circuitally connected to a second intermediate terminal 707.

Each pixel 701 comprises a photosensitive element 710 circuitally connected to a first intermediate terminal 703 and an active device that comprises: a first switch 704 configured to selectively connect the first intermediate terminal 703 of said pixel to the second intermediate terminal 707 of the reference element associated to the column of said pixel; and a second switch 705 configured to selectively connect the first intermediate terminal 703 of the pixel to its output terminal 706. Upon readout of a given pixel 701, the first and second switches 704, 705 are closed, connecting the photosensitive element 710 to the reference element 702, so that the dark current suppressing circuit is in the electrical path between the first intermediate terminal 703 and the output terminal 706.

The image sensor 700 also has a control unit that comprises a readout circuit with as many amplifiers 708 as there are columns, each amplifier 708 having an input terminal circuitally connected to the output terminal 706 of the pixels of a given column, and a storage element 709 connected in series to an output terminal of each amplifier 708, each storage element 709 being configured to store a voltage proportional to the photo-signal generated in a pixel 701 of said given column.

Additionally, the control unit includes an interconnection circuit 720 operatively connected to the readout circuit and that comprises a plurality of output nodes 721. The interconnection circuit 720 allows circuitally connecting, through the readout circuit, the output terminal 706 of any of the pixels 701 of the array with the output nodes 721. Moreover, connected to each output node 721, the control unit also comprises a cascade of a correlation double sampling stage 722, followed by a post-amplification stage 723, and by an analog-to-digital converter 724. In this way, the outputs of the image sensor 700 can be directly interfaced with digital circuitry.

Figure 7B:
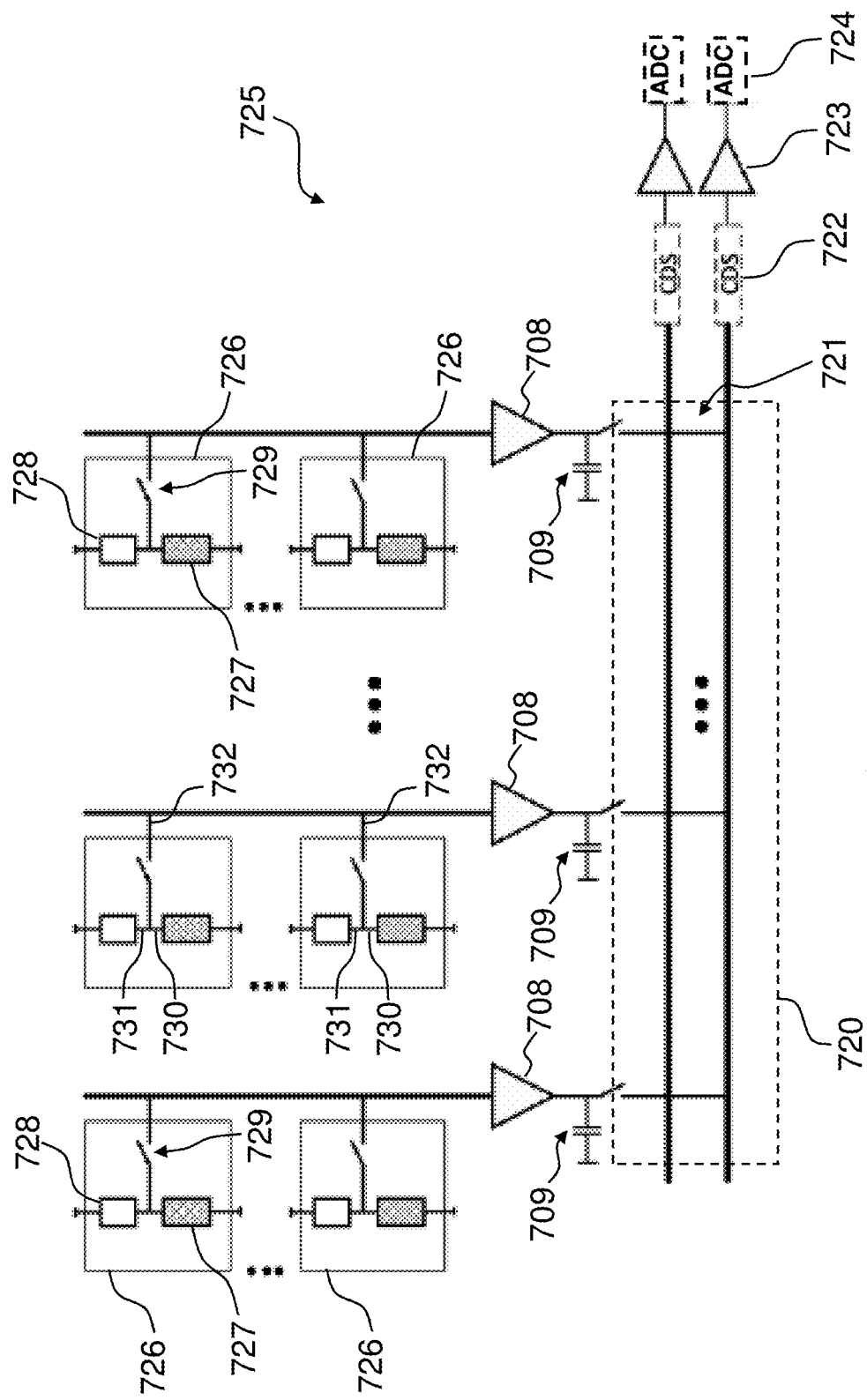
FIG. 7b is a schematic block diagram of another embodiment of an image sensor according to the present invention in which each pixel comprises a reference element, but a same amplifier cascaded to a storage element is shared by several pixels.

In FIG. 7b it is shown a second example of an image sensor similar in topology to the one just described in the context of FIG. 7a, but in which the dark current suppressing circuit has been moved into the pixels, so that each pixel comprises its own reference element.

The image sensor 725 comprises a two-dimensional arrangement of pixels 726. Each pixel 726 comprises a photosensitive element 727 circuitally connected to a first intermediate terminal 730, and a reference element 728 having its second intermediate terminal 731 permanently connected to the first intermediate terminal 730. Additionally, each pixel 726 also comprises an active device that includes a row-select switch 729 operatively coupled between the first intermediate terminal 730 and the output terminal 732 of the pixel.

It is not needed to further describe the readout circuit, the interconnection circuit and the additional blocks comprised in the control unit of the image sensor 725, as they are similar to the ones comprised in the image sensor 700 which has already been described in detail above in the context of FIG. 7a.

Figure 7C:
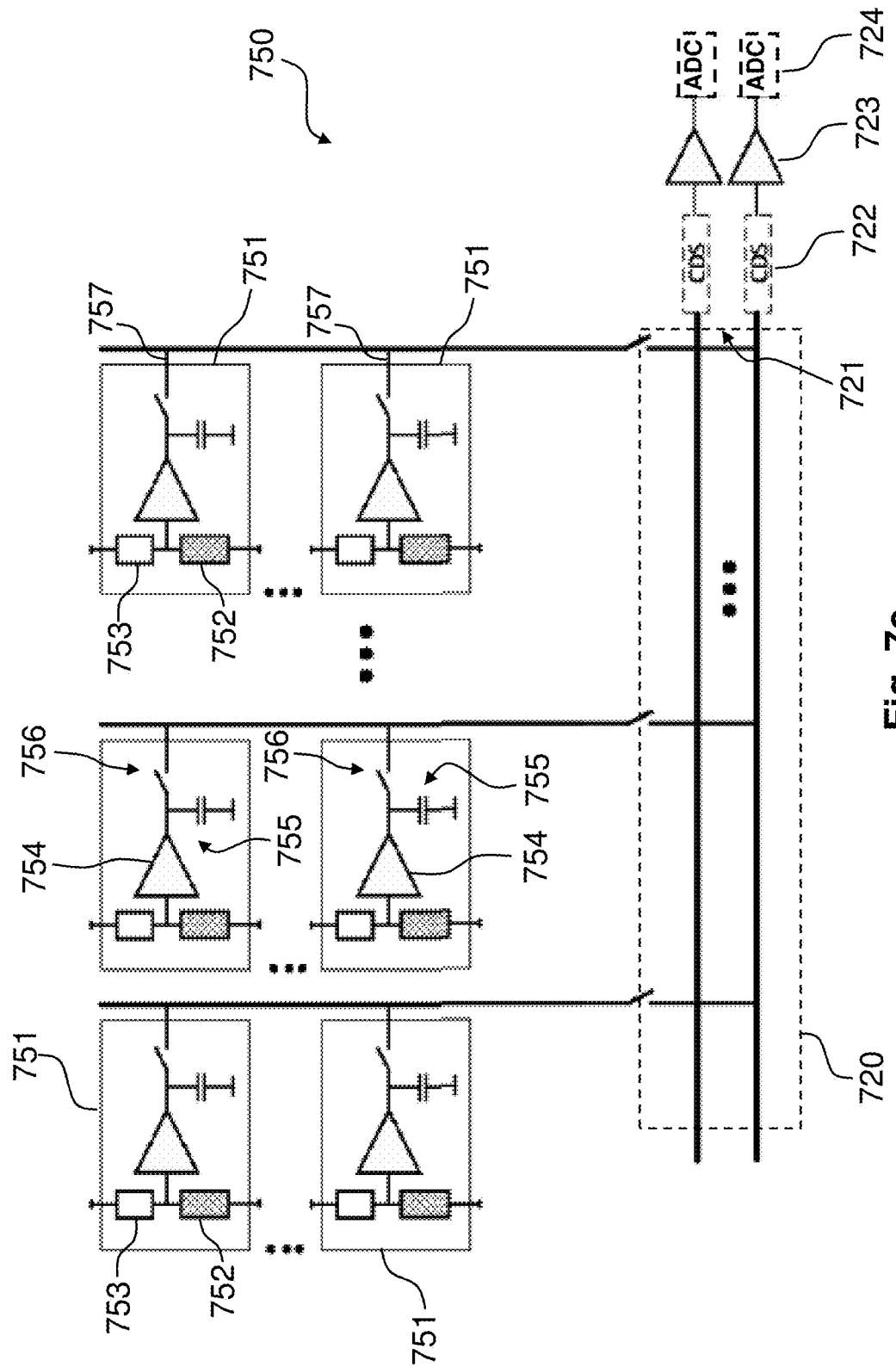
FIG. 7c shows a schematic block diagram of yet another embodiment of an image sensor according to the present invention in which each pixel comprises its own reference element, amplifier and storage element cascaded thereto.

FIG. 7c shows a third example of an image sensor in which, compared to the image sensor 725 shown in FIG. 7b, most of the electronics of the readout circuit has been moved into the pixels.

In particular, each of the pixels 751 of the image sensor 750 comprises a photosensitive element 752 and a reference element 753 connected thereto. The active device comprised in each pixel 751 further comprises:
  an amplifier 754 having an input terminal, circuitally connected to the first intermediate terminal, and an output terminal; and
  a storage element 755 connected in series to the output terminal of the amplifier 754, the storage element 755 being configured to store a voltage proportional to the photo-signal generated in the photosensitive element 752 of the pixel; and a row-select switch 756 connected between the storage element 755 and an output terminal 757 of the pixel, and configured to selectively connect said output terminal 757 to the storage element 755.

Figure 8:
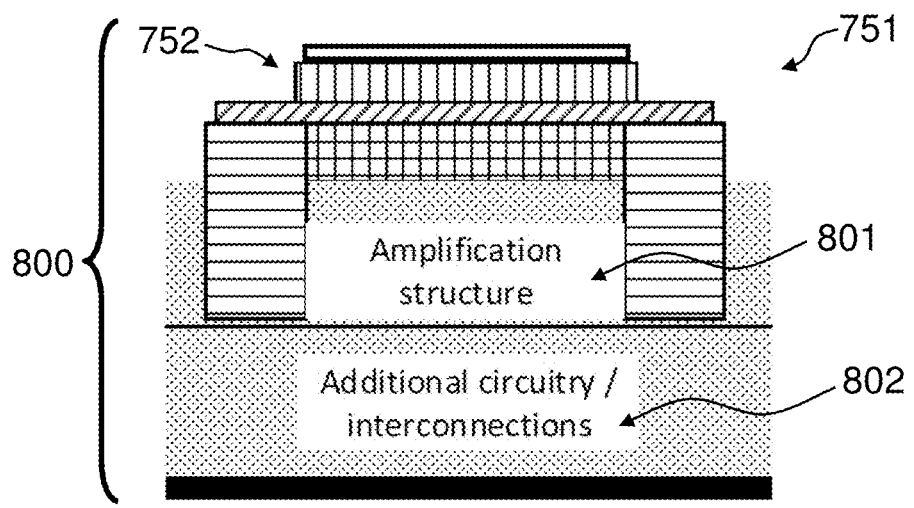
FIG. 8 represents a cross-sectional view of a pixel for an image sensor according to the present invention, in which the active device of the pixel comprises an amplifier arranged in the lower level of the monolithic three-dimensional integrated circuit of the image sensor.

Given that in this example the active device of the pixel 751 includes more electronics, it is advantageous to exploit once again the third dimension of the monolithic three-dimensional integrated circuit of the image sensor 750 and split the circuitry of the active device in two different layers of its lower level, as illustrated in FIG. 8.

The photosensitive element 752 of a pixel 751 is disposed in the upper level of the monolithic three-dimensional integrated circuit 800. The active device of the pixel 751 is arranged in first and second semiconductor layers 801, 802 of the lower level of the monolithic three-dimensional integrated circuit 800. The first semiconductor layer 801 comprises the amplifier 754, while the storage element 755 and the row-select switch 756 are comprised in the second semiconductor layer 802.

Figure 7D:
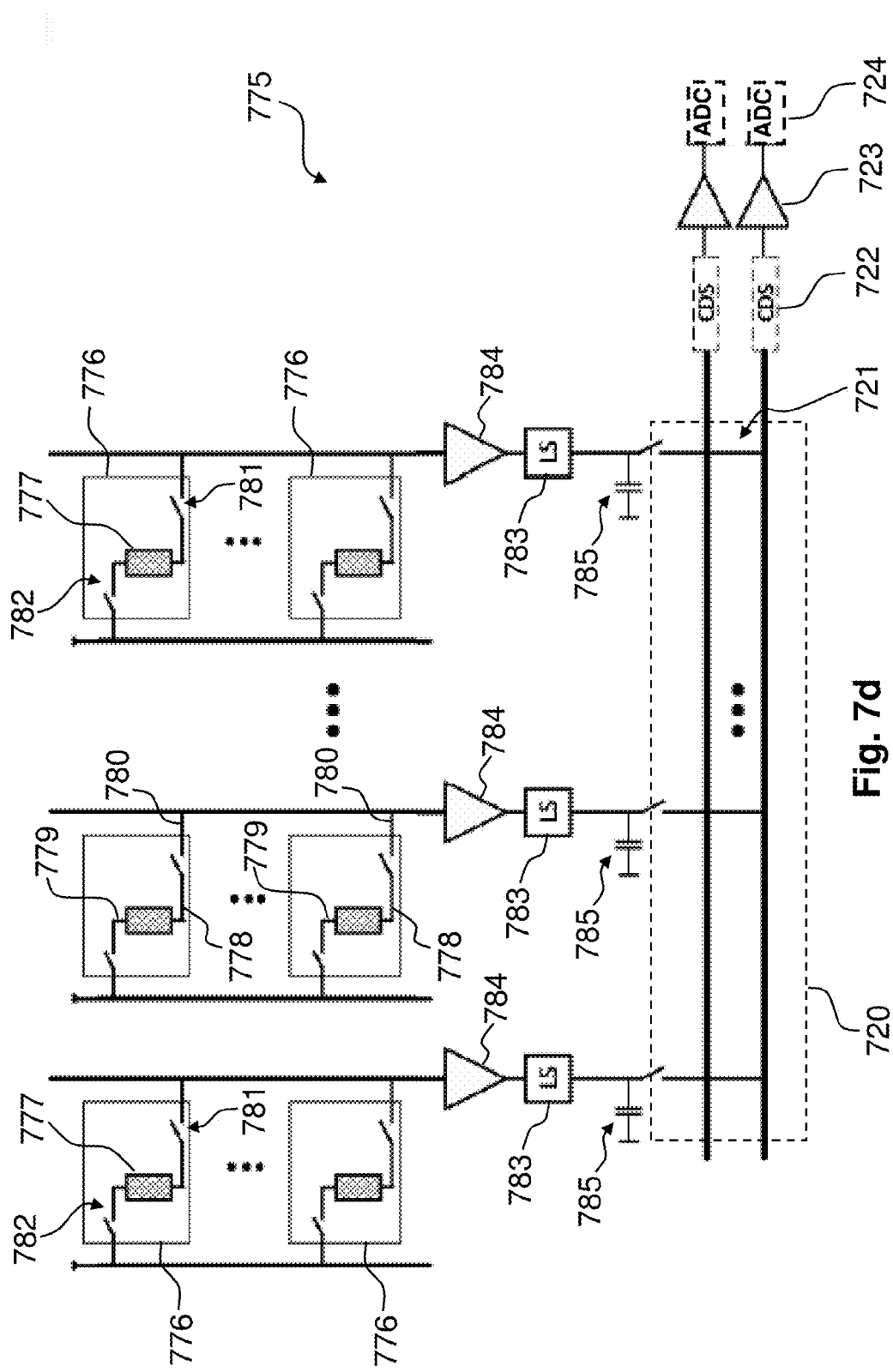
FIG. 7d depicts a schematic block diagram of a further embodiment of an image sensor according to the present invention in which several pixels share a same level shifter, amplifier and storage element.

In FIG. 7d it is shown a fourth example of an image sensor in which the dark current suppressing circuit comprises level shifters instead of reference elements.

The image sensor 775 comprises a two-dimensional arrangement of pixels 776, each comprising a photosensitive element 777 circuitally connected between a first intermediate terminal 778 and a biasing terminal 779. An active device included in each pixel 776 comprises a first switch 781 configured to selectively connect said first intermediate terminal 778 to an output terminal 780 of said pixel, and a second switch 782 configured to selectively connect the biasing terminal 779 to a biasing circuit.

The dark current suppressing circuit of the image sensor 775 comprises as many level shifters 783 as there are columns in the array, each level shifter 783 being associated to the pixels 776 of a different column. In addition, each level shifter 783 is preceded by a transimpedance amplifier 784 having an input terminal circuitally connected to the output terminal of the pixels 776 of a given column. Finally, the readout circuit of the image sensor 775 comprises a storage element 785 connected in series to the output node of each level shifter 783.

As in the previous examples, the interconnection circuit and the additional blocks comprised in the control unit of the image sensor 775 are similar to the ones comprised in the image sensor 700 and already described above in the context of FIG. 7a.

Figure 9:
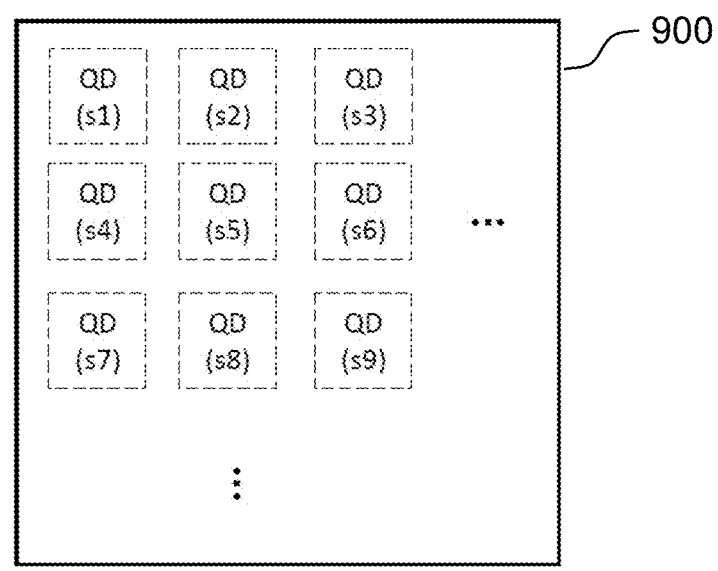
FIG. 9 is a schematic representation of an exemplary image sensor in which its pixels are grouped into clusters, each cluster being sensitive to a different range of the spectrum.

Referring now to FIG. 9, it is there shown an example of an image sensor capable of multispectral response. The image sensor 900 comprises a plurality of pixels arranged as a two-dimensional array and grouped into clusters s1-s9. Each cluster comprises at least one pixel having a photosensitive element with a photosensitizing layer sensitive to a different range of the spectrum. In this particular example, the photosensitizing layer of the photosensitive elements comprises quantum dots, whose size is progressively varied to tune their light absorption properties to different wavelengths.

Figure 11A:
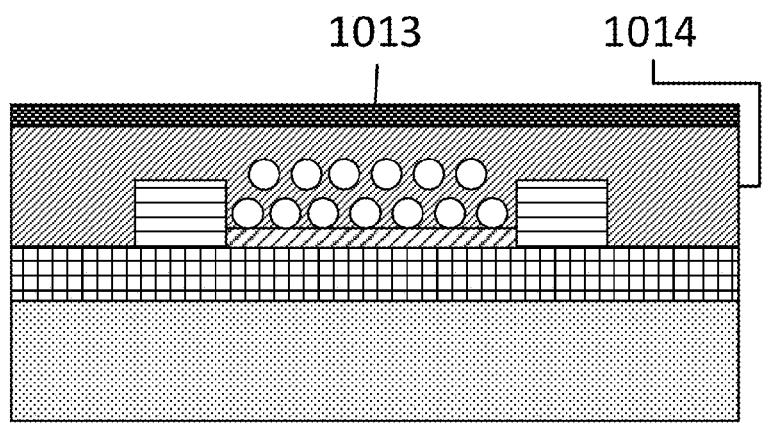
FIGS. 11a and 11b are, respectively, a side view and a plan view of the image sensor of the present invention for an embodiment for which a light-concentrating structure is arranged on top of the image sensor.
Figure 11B:
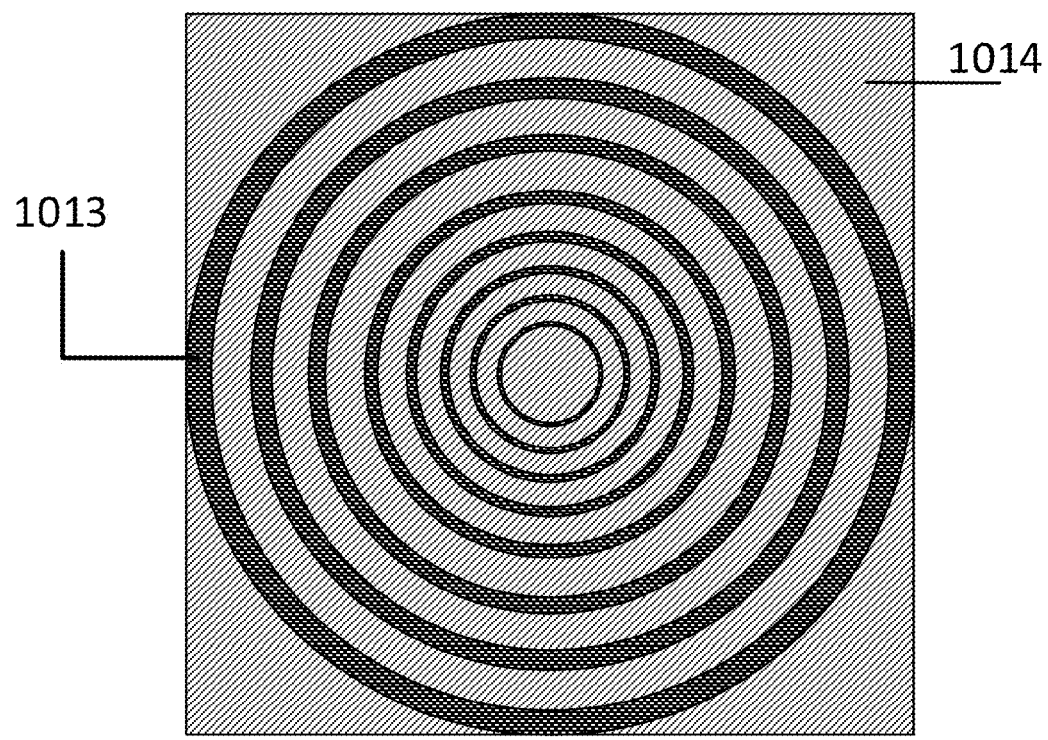

Referring to FIGS. 11a and 11b, they show a further embodiment of the image sensor of the present invention for which a light-concentrating structure 1013 is arranged on top of the image sensor (above each pixel or above some of its pixels), specifically on top of an insulating layer 1014 disposed above the photosensitive element (for a non illustrated embodiment, it could be arranged directly on top of the image sensor, without an insulated layer in between), in order to enhance the response of the photosensitive element. For the illustrated embodiment, the light-concentrating element 1013 is a plasmonic bull's eye metallic structure, although alternatively other geometries of plasmonic and/or dielectric structures that may consist of metals, dielectrics, heavily doped semiconductors or graphene can be used, the choice of which is determined by the spectral range intended to be covered by the image sensor.

Figure 12A:
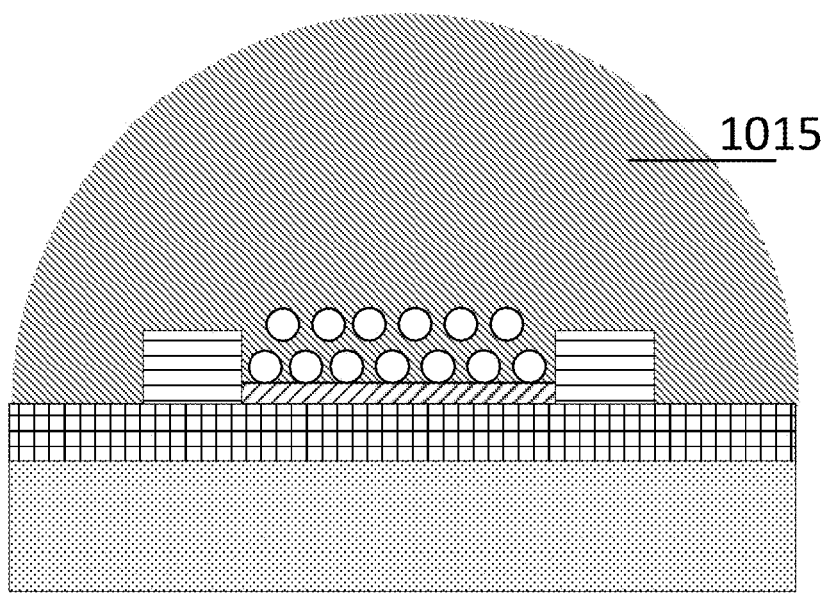
FIGS. 12a and 12b are, respectively, a side view and a plan view of the image sensor of the present invention for an embodiment for which a micro-lens is arranged on top of each pixel.
Figure 12B:
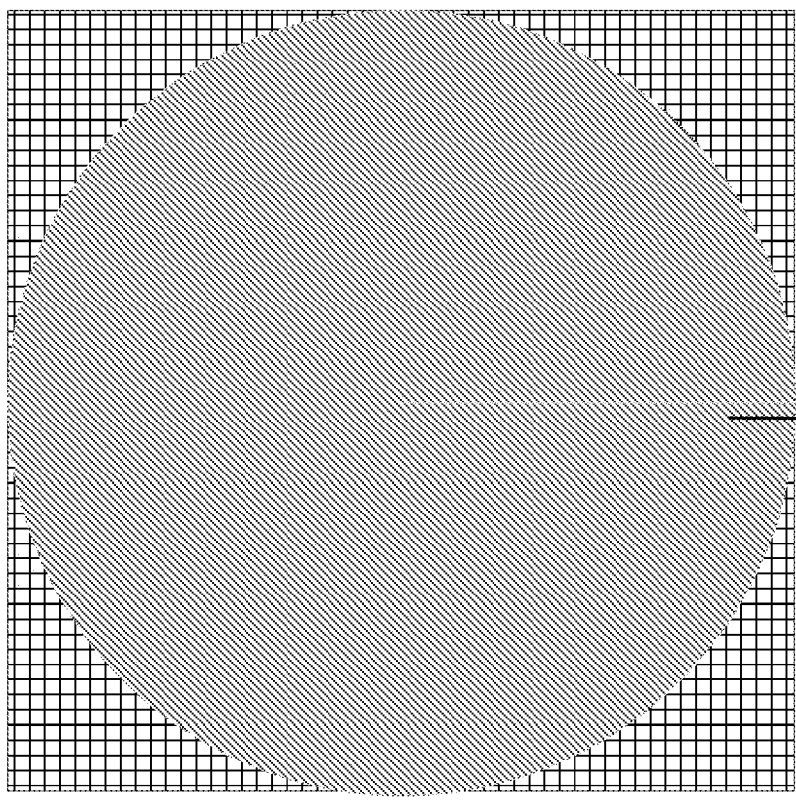

For the embodiment of FIGS. 12a and 12b, the response of the photosensitive element is further enhanced by adding a so-called microlens 1015 on top of each pixel (only one pixel is shown in the figure).

Figure 13:
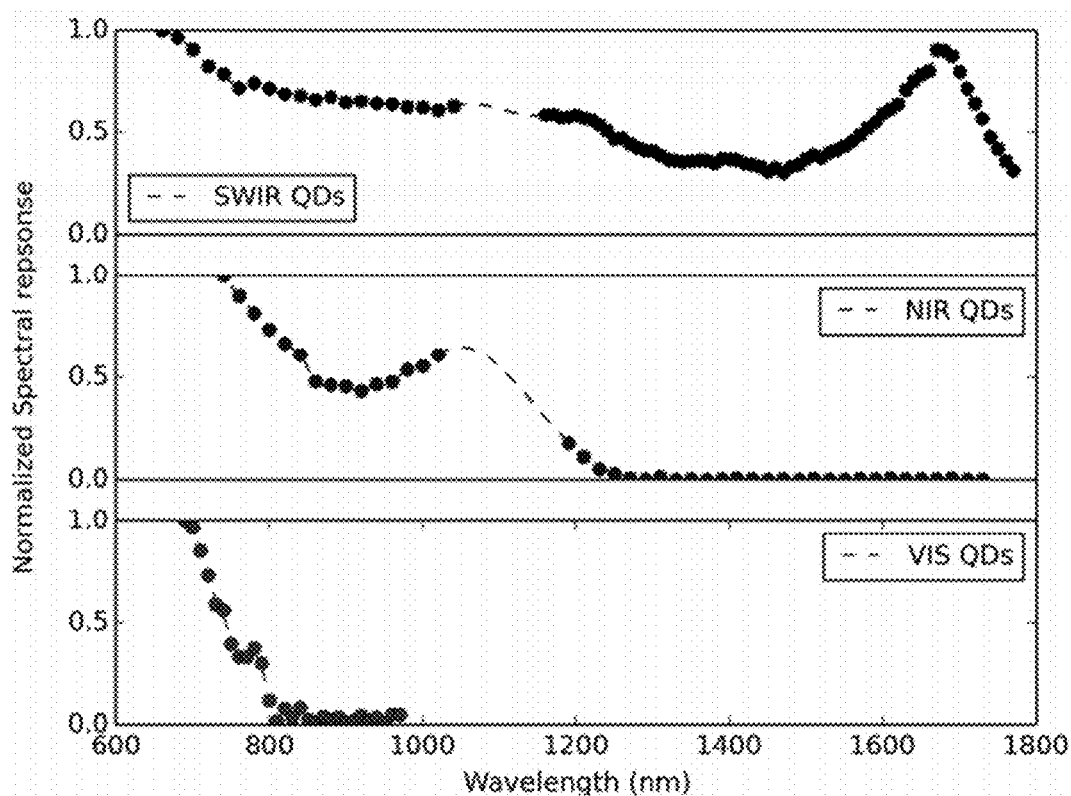
FIG. 13 is a plot showing the normalized spectral response of three different pixels of the image sensor of the present invention for an embodiment for which the image sensor is capable of multispectral response by the inclusion therein of pixels with photosensitizing layers sensitive to different ranges of the light spectrum (such as the one shown in FIG. 9), comprising quantum dots (QD) having different sizes (per pixel), where the waves relate to Short-wave Infrared (SWIR), Near Infrared (NIR) and visible light (VIS).

To demonstrate the spectral tunability of the photosensitive elements of the image sensor of the present invention, a prototype has been built including an arrangement comprising several pixels differing between them in that they are configured for being sensitive to different ranges of the light spectrum, in this case by means of the selection of the quantum dots (specifically the sizes thereof) which form their respective photosensitizing layers, one of which is configured for being sensitive to Short-wave Infrared light (SWIR), another for Near Infrared light (NIR) and another for visible light (VIS). The resulting waves are depicted in FIG. 13, identified as SWIR-QDs, NIR-QDs and VIS-QDs.

Figure 14:
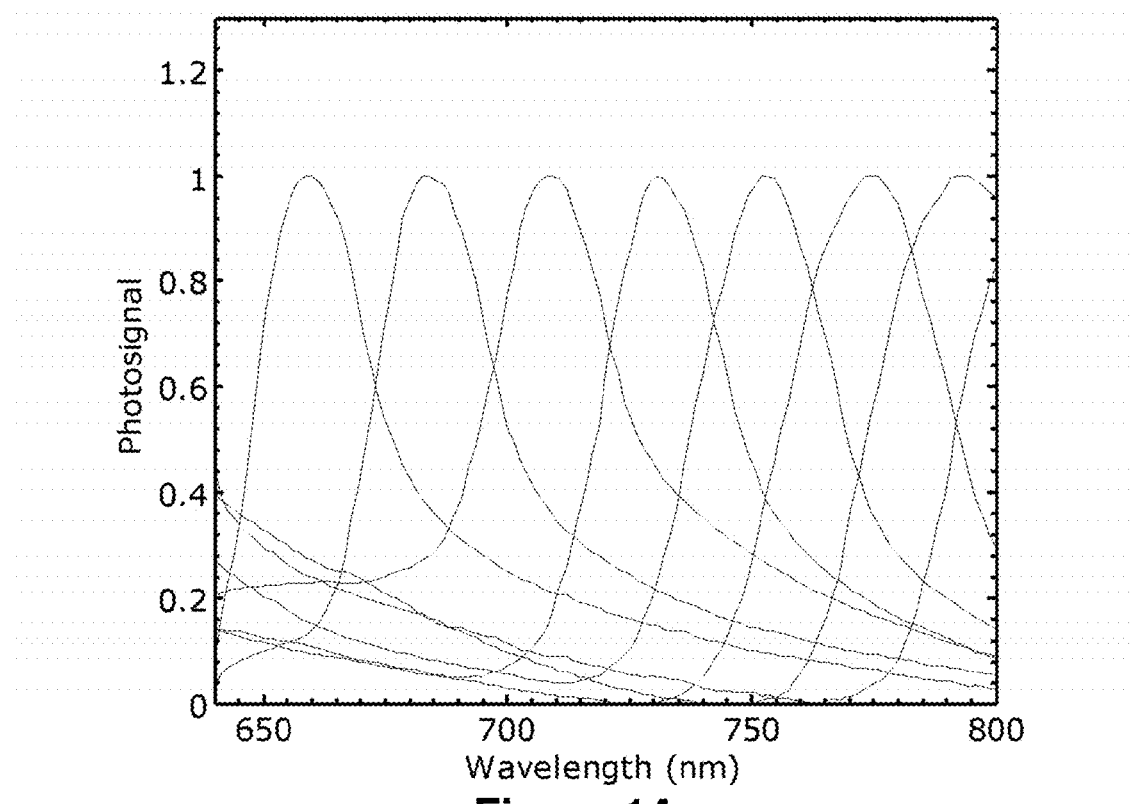
FIG. 14 shows several curves representative of data obtained from a pixelated detector built according to the present invention where the light is transmitted through a diffractive optics system before it hits the pixelated detector. Each curve corresponds to data obtained when the combined system (diffractive optics coupled to the pixelated detector according to the present invention) is illuminated with light of a specific wavelength (corresponding to the wavelength where the maximum in each curve occurs).

In the plot of FIG. 14 data from a pixelated detector built according to the image sensor of the present invention and that is illuminated with diffracted light is shown, said data showing how the present invention allows measuring the spectral decomposition of the impinging light.

The above mentioned data shows that with the image sensor of the present invention a balanced detection to optimize the photosignal and hence benefit from the dark current compensation scheme, can be done.

Figure 15:
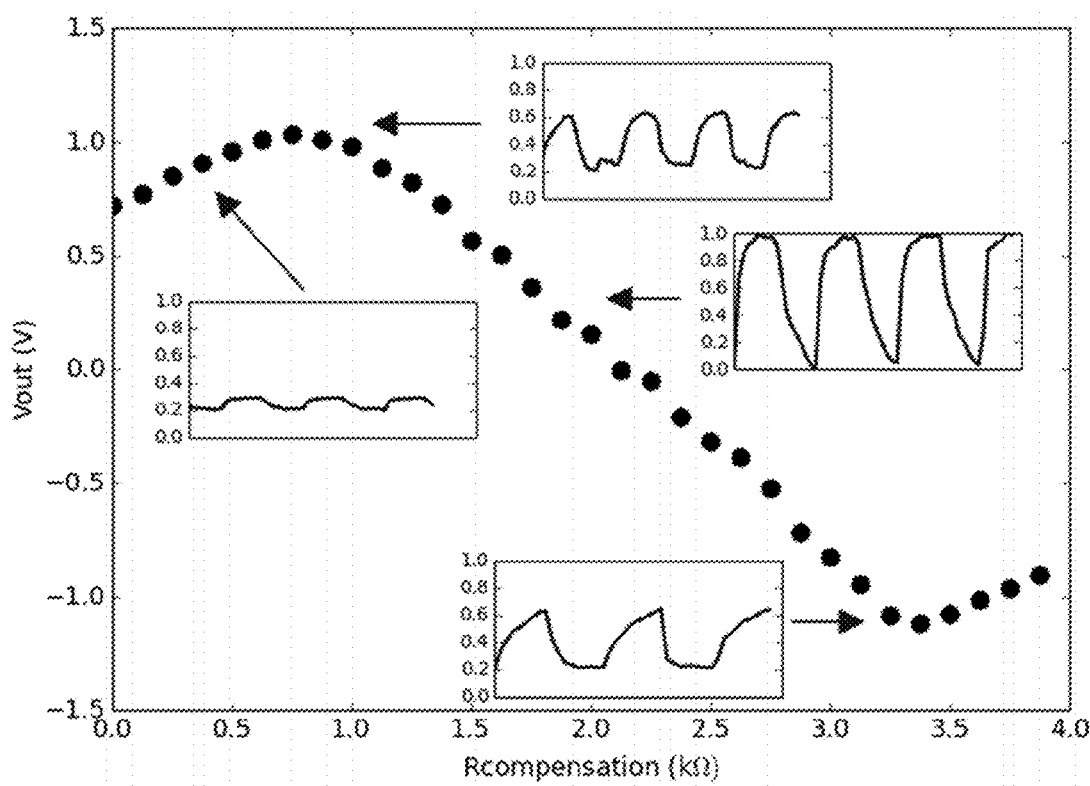
FIG. 15 shows several curves obtained from one pixel of a prototype read out integrated circuit (ROIC) consisting of 288×388 pixels in total with an Rcompensation resistor in series with the pixel resistance built by the inventors.
Figure 16:
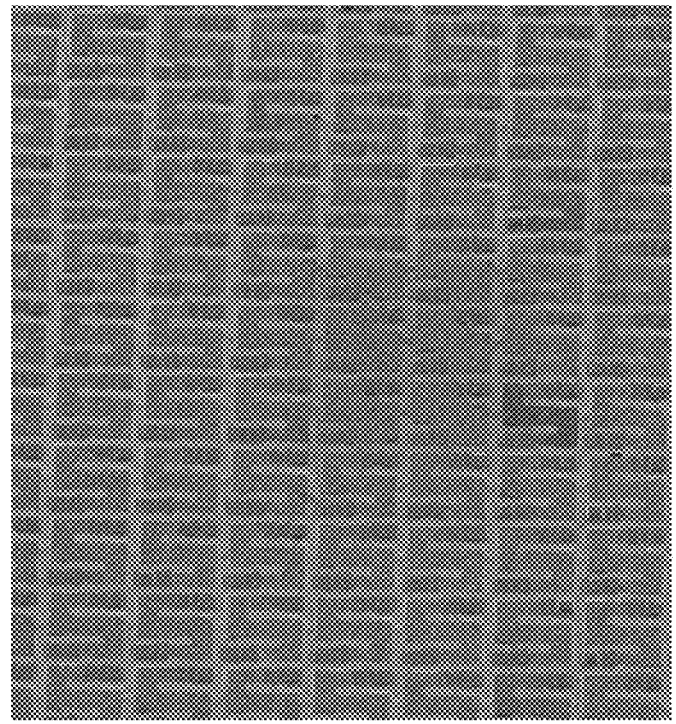
FIG. 16 is a SEM (Scanning Electron Microscopy) image of the ROIC built and used to obtain the curves of FIG. 15.

A prototype read out integrated circuit consisting of 288×388 pixels in total with an Rcompensation resistor (particularly a polysilicon resistor) in series with the pixel resistance has been built (similarly to that of FIG. 4a). The integrated read out circuit has an active area with a diagonal dimension of ⅔" and a pixel pitch of 35μ. The average pixel resistance is 15 kOhm. The Rcompensation resistor is used to match the pixel resistance to the dark current compensation circuit resistance so that the output signal of the circuit under dark conditions is 0 V. The curves as shown in FIG. 15 are obtained from one pixel of a pixelated read out integrated circuit. The main plot of FIG. 15 is the output signal as a function of the Rcompensation resistor showing that for ~2 kOhm compensation the dark current suppression circuit cancels the current through the pixel. At four different Rcompensation resistance values the photo signal as a function of time (under illumination with a 1 Hz chopped beam of light) is plotted showing that we can moreover tune the magnitude of the photosignal by modifying the matching of the pixel resistance to the dark current suppression circuit resistance.

Figure 10:
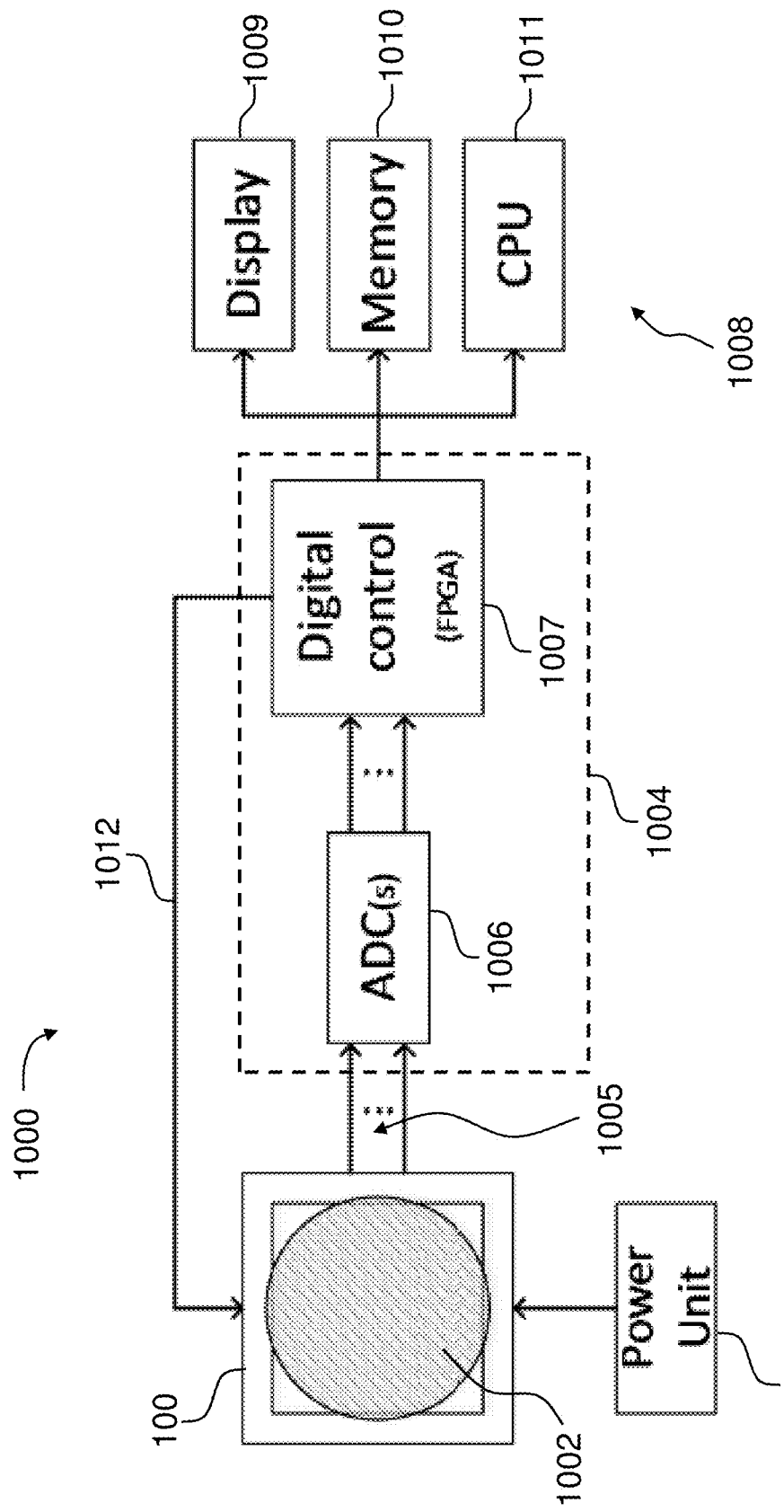
FIG. 10 is a block diagram of an optoelectronic system in accordance with an embodiment of the present invention.

In FIG. 10 it is represented the block diagram of an optoelectronic system, in particular a camera system, which incorporates an image sensor according to the present invention.

The optoelectronic system 1000 comprises the image sensor 100 described in FIGS. 1a and 1b, which is operatively interfaced to an optical module including a lens arrangement 1002.

The lens arrangement 1002 is adapted to focus incoming light on the plurality of pixels 101 of the image sensor 100. The optoelectronic system 1000 also comprises a power supply module 1003 and control module 1004, both operatively connected to the control unit of the image sensor 100.

The power supply module 1003 is configured to provide a biasing voltage to the image sensor 100, while the control module 1004 is configured to provide control signals 1012 to the control unit of the image sensor 100 to selectively read out the pixels 101, and to receive a plurality of detected values 1005 corresponding to the photo-signals read out from the plurality of pixels 101 by the readout circuit 102.

As it can be seen in the figure, the control module 1004 includes an analog-to-digital converter 1006 to digitize the detected values 1005 before they are provided to a digital control circuit 1007 implemented into an FPGA.

The optoelectronic system 1000 further comprises a peripheral module 1008 operatively connected to the control module 1004 that includes a display 1009, a memory unit 1010 and a microprocessor 1011. In this manner, the detected values 1005 can be processed, stored and/or projected as an image.

Finally, the image sensor 100 described above in the context of FIGS. 1a and 1b can be manufactured as a monolithic three-dimensional integrated circuit 104 by means of a method that comprises the steps of:

a) providing at least one layer of semiconductor material on a substrate 118, said at least one layer of semiconductor material forming a lower level 106 of the monolithic three-dimensional integrated circuit 104;

b) for each pixel 101 of the plurality of pixels, arranging an active device 110 at a selected location of the at least one layer of semiconductor material of said lower level 106, and providing an output terminal 111b to the pixel 101;

c) arranging at least a part of the control unit in said lower level 106, and circuitally connecting the output terminal 111b of each pixel to the readout circuit 102 of the control unit;

d) providing a transport layer 109 including at least one layer of a two-dimensional material, and a photosensitizing layer 108 associated to the transport layer 109, the transport layer and the photosensitizing layer forming an upper level 105 of the monolithic three-dimensional integrated circuit 104, said upper level being disposed above said lower level;

e) for each pixel 101 of the plurality of pixels, arranging, for example by means of patterning and/or etching, a photosensitive element 107 at a selected location of said upper level 105, and circuitally connecting the photosensitive element 107 to a first intermediate terminal being provided in said pixel;

f) operatively coupling the photosensitive element 107 of each pixel to the active device 110 of said pixel; and g) providing a dark current suppressing circuit configured to substantially suppress the dark current generated by the photosensitive element of the pixels 101 during an exposure cycle.

While the invention has been described with respect to some specific examples, including presently preferred modes of carrying out the invention, those skilled in the art will appreciate that there are numerous variations and permutations of the above described image sensor, optoelectronic system using said image sensor, and method for manufacturing said image sensor, including substitution of specific elements by others technically equivalent, without departing from the scope of the invention as set forth in the appended claims.

The invention claimed is:

1. An image sensor comprising a plurality of pixels operatively connected to a control unit that includes a readout circuit for selectively reading out the photo-signals generated by the light impinging on the plurality of pixels, wherein the image sensor comprises a monolithic three-dimensional integrated circuit comprising an upper level having a first plurality of stacked layers and a lower level having a second plurality of stacked layers, the lower level being disposed underneath the upper level; wherein each pixel of the plurality of pixels comprises:

a photosensitive element arranged at a selected location of said upper level, the photosensitive element comprising a photosensitizing layer associated to a transport layer, the transport layer including at least one layer of a two-dimensional material;

an active device arranged at a selected location of said lower level, the active device comprising at least one layer of a semiconductor material and being operatively coupled to the photosensitive element;

a first intermediate terminal circuitally connected to the photosensitive element; and an output terminal circuitally connected to the readout circuit;

wherein the image sensor further comprises a dark current suppressing circuit configured to substantially suppress the dark current generated by the photosensitive element of the pixels during an exposure cycle; and wherein the control unit is arranged, at least partially, in said lower level and configured to, when a given pixel is to be read out, circuitally connect the first intermediate terminal of said pixel:

with the output terminal of said pixel through the dark current suppressing circuit; or with the output terminal of said pixel and with the dark current suppressing circuit; or with the output terminal of said pixel, said output terminal being circuitally connected to the readout circuit through the dark current suppressing circuit.

2. The image sensor according to claim 1, wherein the control unit comprises a biasing circuit for biasing the plurality of pixels;

wherein the dark current suppressing circuit comprises at least one reference element having a dark conductance that substantially matches the dark conductance of the photosensitive element of the pixels; wherein the/each reference element is circuitally connected between a second intermediate terminal and a second biasing terminal, the second biasing terminal being circuitally connected to the biasing circuit;

wherein the photosensitive element of each pixel is circuitally connected between the first intermediate terminal of said pixel and a first biasing terminal provided in said pixel, the first biasing terminal of each pixel being circuitally connected to the biasing circuit;

wherein the biasing circuit is adapted to provide a biasing voltage between the first biasing terminal of the photosensitive element of the pixels of the plurality of pixels and the second biasing terminal of the at least one reference element; and wherein the control unit is configured to, when a given pixel is to be read out, circuitally connect the first intermediate terminal of said pixel and the second intermediate terminal of a reference element of said at least one reference element with the output terminal of said pixel.

3. The image sensor according to claim 2, wherein a reference element of the at least one reference element is arranged in said upper level and comprises a transport layer including at least one layer of a two-dimensional material.

4. The image sensor according to claim 3, wherein said reference element further comprises a photosensitizing layer associated to the transport layer of said reference element.

5. The image sensor according to claim 4, wherein said reference element further comprises: a first light-blocking layer disposed above the photosensitizing layer and the transport layer of said reference element.

6. The image sensor according to claim 5, wherein a second light-blocking layer is disposed below the photosensitizing layer and the transport layer of said reference element.

7. The image sensor according to claim 3, wherein said reference element is arranged below the photosensitive element of a pixel of the plurality of pixels.

8. The image sensor according to claim 2, wherein a reference element of the at least one reference element is arranged in said lower level and comprises a variable resistor.

9. The image sensor according to claim 1, wherein the upper level comprises one or more insulating layers associated to the photosensitive element of the plurality of pixels.

10. The image sensor according to claim 9, wherein at least one pixel of the plurality of pixels comprises:
    a back-gate terminal disposed below the photosensitive element of said at least one pixel, between an insulating layer disposed below the photosensitive element of the plurality of pixels and the lower level of the monolithic three-dimensional integrated circuit; and/or
    a top-gate terminal disposed above the photosensitive element of said at least one pixel.

11. The image sensor according to claim 1, wherein at least one pixel of the plurality of pixels comprises a conductive interconnect to couple the active device of said pixel to the photosensitive element of said pixel, the conductive interconnect comprising:
    a vertical contact extending from the lower level to the upper level of the monolithic three-dimensional integrated circuit and having a first section connected to the active device of said pixel, said first section being disposed on the at least one semiconductor layer of said active device; and
    a lateral contact arranged on said upper level and connected to a second section of the vertical contact;
    wherein the lateral contact is ohmically connected to the transport layer of the photosensitive element of said pixel and comprises portion being parallel to the transport layer of said photosensitive element.

12. The image sensor according to claim 1, wherein the active device of each pixel of the plurality of pixels comprises at least one of: a switch, an amplifier, a filter, a digitizer, a level shifter and a storage element.

13. The image sensor according to claim 1, wherein the plurality of pixels are grouped into clusters, each cluster comprising one or more pixels; and wherein the photosensitizing layer of the photosensitive element of the one or more pixels of each cluster is sensitive to a different range of the spectrum.

14. The image sensor according to claim 1, wherein, for at least one pixel of the plurality of pixels, the active device of said at least one pixel is operatively coupled to the first intermediate terminal of the photosensitive element of said at least one pixel.

15. The image sensor according to claim 2, wherein the plurality of pixels are arranged as a two-dimensional array comprising a plurality of rows and columns; wherein the dark current suppressing circuit comprises as many reference elements as there are columns in the array, each reference element being associated to the pixels of a different column; wherein the active device of each pixel comprises a first switch configured to selectively connect the first intermediate terminal of the pixel to the second intermediate terminal of the reference element associated to the column of said pixel, and a second switch configured to selectively connect the first intermediate terminal of the pixel to its output terminal; and wherein the readout circuit comprises:
    as many amplifiers as there are columns, each amplifier having an input terminal, circuitally connected to the output terminal of the pixels of a given column; and
    a storage element connected in series to an output terminal of each amplifier, each storage element being configured to store a voltage proportional to the photosignal generated in a pixel of said given column.

16. The image sensor according to claim 2, wherein the plurality of pixels are arranged as a two-dimensional array comprising a plurality of rows and columns; wherein the dark current suppressing circuit comprises a reference element arranged in each pixel of the plurality of pixels, each reference element having its second intermediate terminal connected to the first intermediate terminal of the pixel; and wherein the active device of each pixel comprises a row-select switch connected to its output terminal.

17. An optoelectronic system comprising:
    an image sensor comprising a plurality of pixels operatively connected to a control unit that includes a readout circuit for selectively reading out the photosignals generated by the light impinging on the plurality of pixels, wherein the image sensor comprises a monolithic three-dimensional integrated circuit comprising an upper level having a first plurality of stacked layers and a lower level having a second plurality of stacked layers, the lower level being disposed underneath the upper level;
    wherein each pixel of the plurality of pixels comprises:
        a photosensitive element arranged at a selected location of said upper level, the photosensitive element comprising a photosensitizing layer associated to a transport layer, the transport layer including at least one layer of a two-dimensional material;
        an active device arranged at a selected location of said lower level, the active device comprising at least one layer of a semiconductor material and being operatively coupled to the photosensitive element;
        a first intermediate terminal circuitally connected to the photosensitive element; and
        an output terminal circuitally connected to the readout circuit;
    wherein the image sensor further comprises a dark current suppressing circuit configured to substantially suppress the dark current generated by the photosensitive element of the pixels during an exposure cycle; and
    wherein the control unit is arranged, at least partially, in said lower level and configured to, when a given pixel is to be read out, circuitally connect the first intermediate terminal of said pixel:
        with the output terminal of said pixel through the dark current suppressing circuit; or
        with the output terminal of said pixel and with the dark current suppressing circuit; or
        with the output terminal of said pixel, said output terminal being circuitally connected to the readout circuit through the dark current suppressing circuit;

an optical module operatively interfaced to the image sensor, the optical module being adapted to focus incoming light on the plurality of pixels;

a power supply module operatively connected to the control unit of the image sensor, the power supply module being configured to provide a biasing voltage to the image sensor;

an analog and/or digital control module operatively connected to the control unit of the image sensor, the analog and/or digital control module being configured to provide control signals to the control unit to selectively read out the pixels, and to receive a plurality of detected values corresponding to the photo-signals read out from the plurality of pixels by the readout circuit; and a peripheral module operatively connected to the analog and/or digital control module, the peripheral module being configured to process, store and/or render an image obtained from the plurality of detected values.

18. A method for manufacturing an image sensor as a monolithic three-dimensional integrated circuit, wherein the image sensor comprises a plurality of pixels operatively connected to a control unit that includes a readout circuit for selectively reading out the photo-signals generated by the light impinging on the plurality of pixels, the method comprising the steps of:

h) providing at least one layer of semiconductor material on a substrate, said at least one layer of semiconductor material forming a lower level of the monolithic three-dimensional integrated circuit;

i) for each pixel of the plurality of pixels, arranging an active device at a selected location of the at least one layer of semiconductor material of said lower level, and providing an output terminal to the pixel;

j) arranging at least a part of the control unit in said lower level, and circuitally connecting the output terminal of each pixel to the readout circuit of the control unit;

k) providing a transport layer including at least one layer of a two-dimensional material, and a photosensitizing layer associated to the transport layer, the transport layer and the photosensitizing layer forming an upper level of the monolithic three-dimensional integrated circuit, said upper level being disposed above said lower level;

l) for each pixel of the plurality of pixels, arranging a photosensitive element at a selected location of said upper level, and circuitally connecting the photosensitive element to a first intermediate terminal being provided in said pixel;

m) operatively coupling the photosensitive element of each pixel to the active device of said pixel; and n) providing a dark current suppressing circuit configured to substantially suppress the dark current generated by the photosensitive element of the pixels during an exposure cycle;

wherein the control unit is configured to, when a given pixel is to be read out, circuitally connect the first intermediate terminal of said pixel:

with the output terminal of said pixel through the dark current suppressing circuit, or with the output terminal of said pixel and with the dark current suppressing circuit; or with the output terminal of said pixel, said output terminal being circuitally connected to the readout circuit through the dark current suppressing circuit.

19. The method according to claim 18, wherein the control unit further includes a biasing circuit for biasing the plurality of pixels; wherein the dark current suppressing circuit comprises at least one reference element having a dark conductance that substantially matches the dark conductance of the photosensitive element of the pixels; wherein the method further comprises the step of:

for each pixel of the plurality of pixels, circuitally connecting the photosensitive element between the first intermediate terminal and a first biasing terminal being provided in said pixel;

circuitally connecting the/each reference element between a second intermediate terminal and a second biasing terminal being provided in the monolithic three-dimensional integrated circuit;

circuitally connecting the first biasing terminal of each pixel of the plurality of pixels and the second biasing terminal of the at least one reference element to the biasing circuit; and wherein the control unit is configured to, when a given pixel is to be read out, circuitally connect the first intermediate terminal of said pixel and the second intermediate terminal of a reference element of said at least one reference element with the output terminal of said pixel.

* * * * *